(12) United States Patent
Choi et al.

(10) Patent No.: US 10,892,278 B2
(45) Date of Patent: *Jan. 12, 2021

(54) THREE-DIMENSIONAL SEMICONDUCTOR DEVICES

(71) Applicant: SAMSUNG ELECTRONICS CO., LTD., Suwon-si (KR)

(72) Inventors: Ji-Hoon Choi, Seongnam-si (KR); Sunggil Kim, Yongin-si (KR); Seulye Kim, Seoul (KR); Hongsuk Kim, Yongin-si (KR); Phil Ouk Nam, Suwon-si (KR); Jaeyoung Ahn, Seongnam-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

This patent is subject to a terminal disclaimer.

(21) Appl. No.: 16/509,169

(22) Filed: Jul. 11, 2019

(65) Prior Publication Data

US 2019/0333937 A1  Oct. 31, 2019

Related U.S. Application Data

(62) Division of application No. 15/849,121, filed on Dec. 20, 2017, now Pat. No. 10,396,094.

(30) Foreign Application Priority Data

Apr. 25, 2017 (KR) .................. 10-2017-0053103

(51) Int. Cl.
*H01L 27/11582* (2017.01)
*H01L 29/06* (2006.01)
(Continued)

(52) U.S. Cl.
CPC .... *H01L 27/11582* (2013.01); *H01L 27/1157* (2013.01); *H01L 27/11565* (2013.01);
(Continued)

(58) Field of Classification Search
CPC ....................... H01L 29/7926; H01L 29/0649
See application file for complete search history.

(56) References Cited

U.S. PATENT DOCUMENTS 8,617,947 B2  12/2013  Yang et al.
8,669,608 B2  3/2014  Sato et al.
(Continued)

FOREIGN PATENT DOCUMENTS

KR   10-2011-0000961 A   1/2011

*Primary Examiner* — Farun Lu
(74) *Attorney, Agent, or Firm* — Volentine, Whitt & Francos, PLLC

(57) ABSTRACT

A three-dimensional semiconductor device includes gate electrodes sequentially stacked on a substrate, a channel structure penetrating the gate electrodes and being connected to the substrate, an insulating gap-fill pattern provided within the channel structure and surrounded by the channel structure as viewed in a plan view, and a conductive pattern on the insulating gap-fill pattern. At least a portion of the insulating gap-fill pattern is received in the conductive pattern, and at least a portion of the conductive pattern is interposed between at least that portion of the insulating gap-fill pattern and the channel structure.

6 Claims, 20 Drawing Sheets

(51) Int. Cl.
*H01L 29/792* (2006.01)
*H01L 29/66* (2006.01)
*H01L 27/11565* (2017.01)
*H01L 29/10* (2006.01)
*H01L 21/28* (2006.01)
*H01L 27/1157* (2017.01)
*H01L 29/78* (2006.01)
*H01L 21/02* (2006.01)
*H01L 21/311* (2006.01)
*H01L 29/51* (2006.01)

(52) U.S. Cl.
CPC ...... *H01L 29/0649* (2013.01); *H01L 29/1037* (2013.01); *H01L 29/40117* (2019.08); *H01L 29/66833* (2013.01); *H01L 29/7827* (2013.01); *H01L 29/7926* (2013.01); H01L 21/0262 (2013.01); H01L 21/02532 (2013.01); H01L 21/02636 (2013.01); H01L 21/31111 (2013.01); H01L 21/31144 (2013.01); H01L 29/513 (2013.01); H01L 29/518 (2013.01); H01L 29/66553 (2013.01)

(56) References Cited

U.S. PATENT DOCUMENTS

| | | | |
|---|---|---|---|
| 9,305,933 | B2 | 4/2016 | Lee |
| 9,397,111 | B1 | 7/2016 | Chowdhury et al. |
| 9,406,690 | B2 | 8/2016 | Pang et al. |
| 9,437,607 | B2 | 9/2016 | Park et al. |
| 9,520,408 | B2 | 12/2016 | Kim |
| 9,530,899 | B2 | 12/2016 | Kim et al. |
| 9,691,785 | B2 | 6/2017 | Lee et al. |
| 10,396,094 | B2* | 8/2019 | Choi ................. H01L 29/40117 |
| 2013/0241754 | A1 | 9/2013 | Narathong et al. |
| 2013/0341754 | A1* | 12/2013 | Doris ................ H01L 21/76283 257/506 |
| 2015/0243672 | A1* | 8/2015 | Kim .................. H01L 27/1157 257/324 |
| 2016/0049421 | A1 | 2/2016 | Zhang et al. |
| 2016/0056302 | A1 | 2/2016 | Bin et al. |
| 2016/0064406 | A1 | 3/2016 | Natori et al. |
| 2016/0079068 | A1 | 3/2016 | Ishigaki et al. |
| 2016/0204115 | A1* | 7/2016 | Ko ....................... H01L 21/764 257/329 |

* cited by examiner

THREE-DIMENSIONAL SEMICONDUCTOR DEVICES

PRIORITY STATEMENT

This is a Divisional of U.S. application Ser. No. 15/849,121, filed Dec. 20, 2017, which claims priority under 35 U.S.C. § 119 to Korean Patent Application No. 10-2017-0053103, filed on Apr. 25, 2017, in the Korean Intellectual Property Office, the entire contents of which are hereby incorporated by reference.

BACKGROUND

The inventive concept relates to a semiconductor device, and in particular, to a three-dimensional semiconductor device, in which memory cells are three-dimensionally arranged.

Higher integration of semiconductor devices is required to satisfy consumer demands for electronic products offering superior performance at inexpensive prices. In the case of semiconductor devices, because their integration is an important factor in determining product prices, increased integration is especially required. In the case of typical two-dimensional or planar semiconductor memory devices, because their integration is mainly determined by the area occupied by a unit memory cell, integration is greatly influenced by the level of a fine pattern forming technology. However, the extremely expensive process equipment needed to increase pattern fineness sets a practical limitation on increasing integration for two-dimensional or planar semiconductor devices.

To overcome such a limitation, three-dimensional (3D) semiconductor devices including three-dimensionally-arranged memory cells have been proposed. However, there are significant manufacturing obstacles in achieving low-cost, mass-production of 3D semiconductor devices, particularly in the mass-fabrication of 3D devices that maintain or exceed the operational reliability of their 2D counterparts.

SUMMARY

According to some examples of the inventive concept, a three-dimensional semiconductor device includes a stack of layers comprising gate electrodes disposed one over another on a substrate, a channel structure extending through the gate electrodes and connected to the substrate, an insulating gap-fill pattern disposed within the channel structure and surrounded by the channel structure as viewed in a plan view, and a conductive pattern on the insulating gap-fill pattern. A portion of the insulating gap-fill pattern extends into the conductive pattern, and at least a portion of the conductive pattern is interposed between the portion of the insulating gap-fill pattern and the channel structure.

Also, according to some examples of the inventive concept, a three-dimensional semiconductor device includes a stack of layers comprising gate electrodes disposed one over another on a substrate, a channel structure extending through the gate electrodes to the substrate, an insulating gap-fill pattern disposed within the channel structure and surrounded by the channel structure as viewed in a plan view, and a conductive pattern on the insulating gap-fill pattern. The insulating gap-fill pattern comprises a first insulating pattern covering an inner surface of the channel structure, and a second insulating pattern disposed within the first insulating pattern. The second insulating pattern comprises a material having an etch selectivity with respect to the first insulating pattern, and a portion of the second insulating pattern extends into the conductive pattern.

Also, according to some examples of the inventive concept, a three-dimensional semiconductor device includes a substrate having an upper surface, a stack of layers comprising gate electrodes disposed one above another on the upper surface of the substrate, a channel structure extending vertically through the gate electrodes and comprising a tubular body of semiconductor material, an insulating gap-fill pattern of electrically insulating material disposed within and surrounded by the tubular body of the channel structure as viewed in a plan view, and a conductive pattern of electrically conductive material capping the insulating gap-fill pattern. The conductive pattern has a first portion having a bottom surface facing towards the substrate, and a second portion disposed radially outwardly of the first portion and having a bottom surface facing towards the substrate. The bottom surface of the first portion of the conductive pattern is situated at a level higher than that of the bottom surface of the second portion of the conductive pattern, relative to the upper surface of the substrate. The bottom surface of the second portion of the conductive pattern is situated at a level closer to that of an uppermost one of the gate electrodes than a level at which the bottom surface of the first portion of the conductive pattern is situated. The insulating gap-fill pattern has a core portion and a sheath portion extending around the core portion. And, a part of the core portion projects beyond the sheath portion and into the conductive pattern at an end of the insulating gap-fill pattern.

BRIEF DESCRIPTION OF THE DRAWINGS

The inventive concept will be more clearly understood from the following brief description taken in conjunction with the accompanying drawings. The accompanying drawings represent non-limiting, examples of the inventive concept as described herein.

It should be noted that these figures are intended to illustrate the general characteristics of methods, structure and/or materials utilized in certain example examples and to supplement the written description provided below. These drawings are not, however, to scale and may not precisely reflect the precise structural or performance characteristics of any given example, and should not be interpreted as defining or limiting the range of values or properties encompassed by the inventive concept. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

The inventive concept will now be described more fully with reference to the accompanying drawings, in which examples of the inventive concept are shown.

Figure 1:
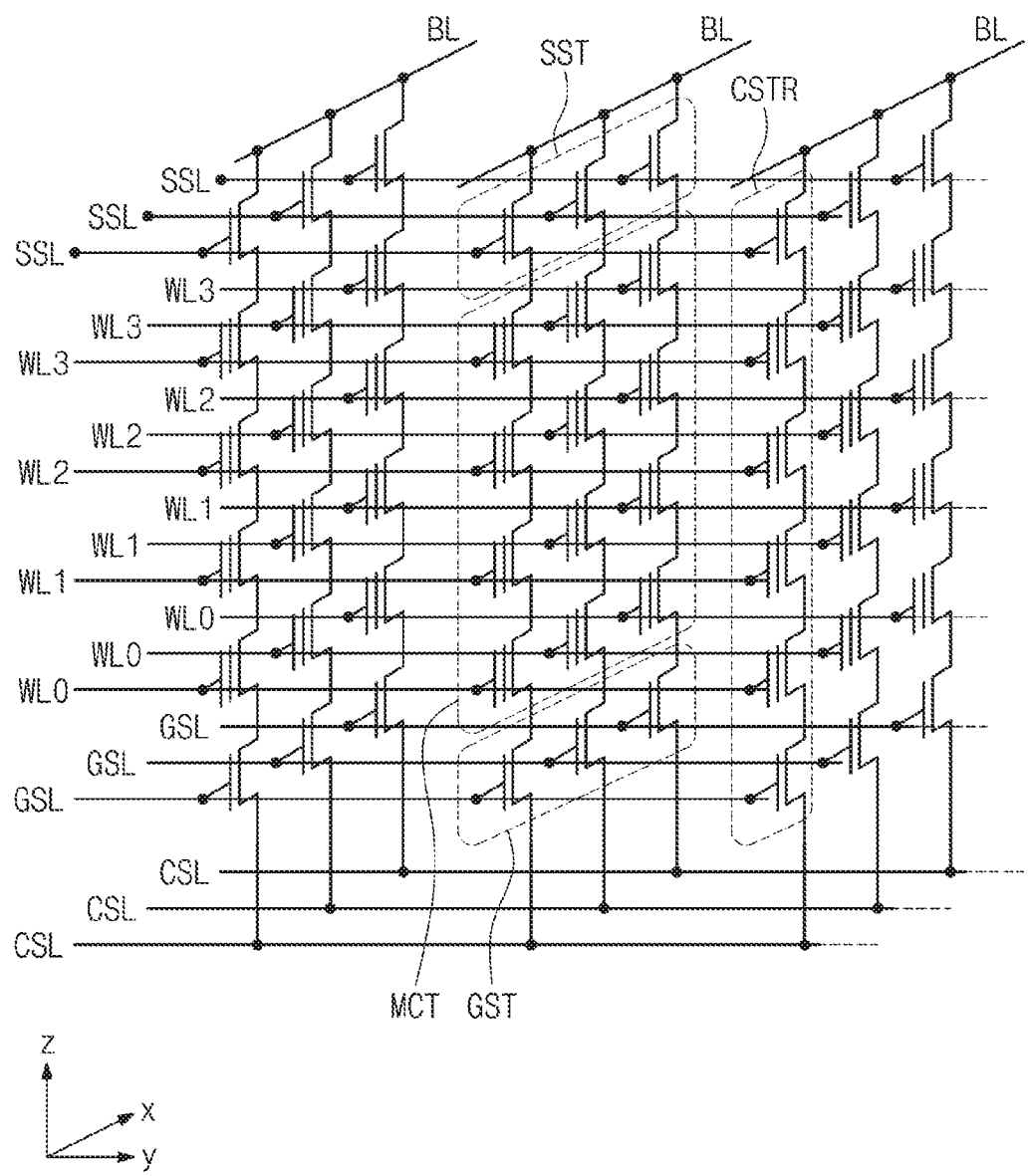
FIG. 1 is a circuit diagram schematically illustrating a cell region of a three-dimensional semiconductor memory device according to some examples of the inventive concept.

FIG. 1 is a circuit diagram schematically illustrating a cell region of examples of a three-dimensional semiconductor memory device according to the inventive concept.

Referring to FIG. 1, a cell array of a three-dimensional semiconductor memory device may include a common source line CSL, a plurality of bit lines BL, and a plurality of cell strings CSTR disposed between the common source line CSL and the bit lines BL.

The common source line CSL may be a conductive pattern disposed on a substrate or an impurity region formed in the substrate. The bit lines BL may be conductive patterns (e.g., metal lines) that are vertically spaced apart from the substrate. The bit lines BL may be two-dimensionally arranged and a plurality of cell strings CSTR may be connected in parallel to each of the bit lines BL. The cell strings CSTR may be connected in common to the common source line CSL. For example, a plurality of the cell strings CSTR may be disposed between the bit lines BL and the common source line CSL. In certain examples, a plurality of common source lines CSL may be two-dimensionally arranged on the substrate. In some examples, the common source lines CSL may be at the same potential difference, but in certain examples, the common source lines CSL may be electrically separated from each other and accordingly, may be independently controlled.

Each of the cell strings CSTR may include a ground selection transistor GST coupled to the common source line CSL, a string selection transistor SST coupled to the bit line BL, and a plurality of memory cell transistors MCT disposed between the ground and string selection transistors GST and SST. Furthermore, the ground selection transistor GST, the string selection transistor SST, and the memory cell transistors MCT may be connected in series.

The common source line CSL may be connected in common to source regions of the ground selection transistors GST. Furthermore, at least one ground selection line GSL, a plurality of word lines WL0-WL3, and a plurality of string selection lines SSL may be disposed between the common source line CSL and the bit lines BL and may serve as gate electrodes of the ground selection transistor GST, the memory cell transistors MCT, and the string selection transistors SST, respectively. In addition, each of the memory cell transistors MCT may include a data storage element.

Figure 2:
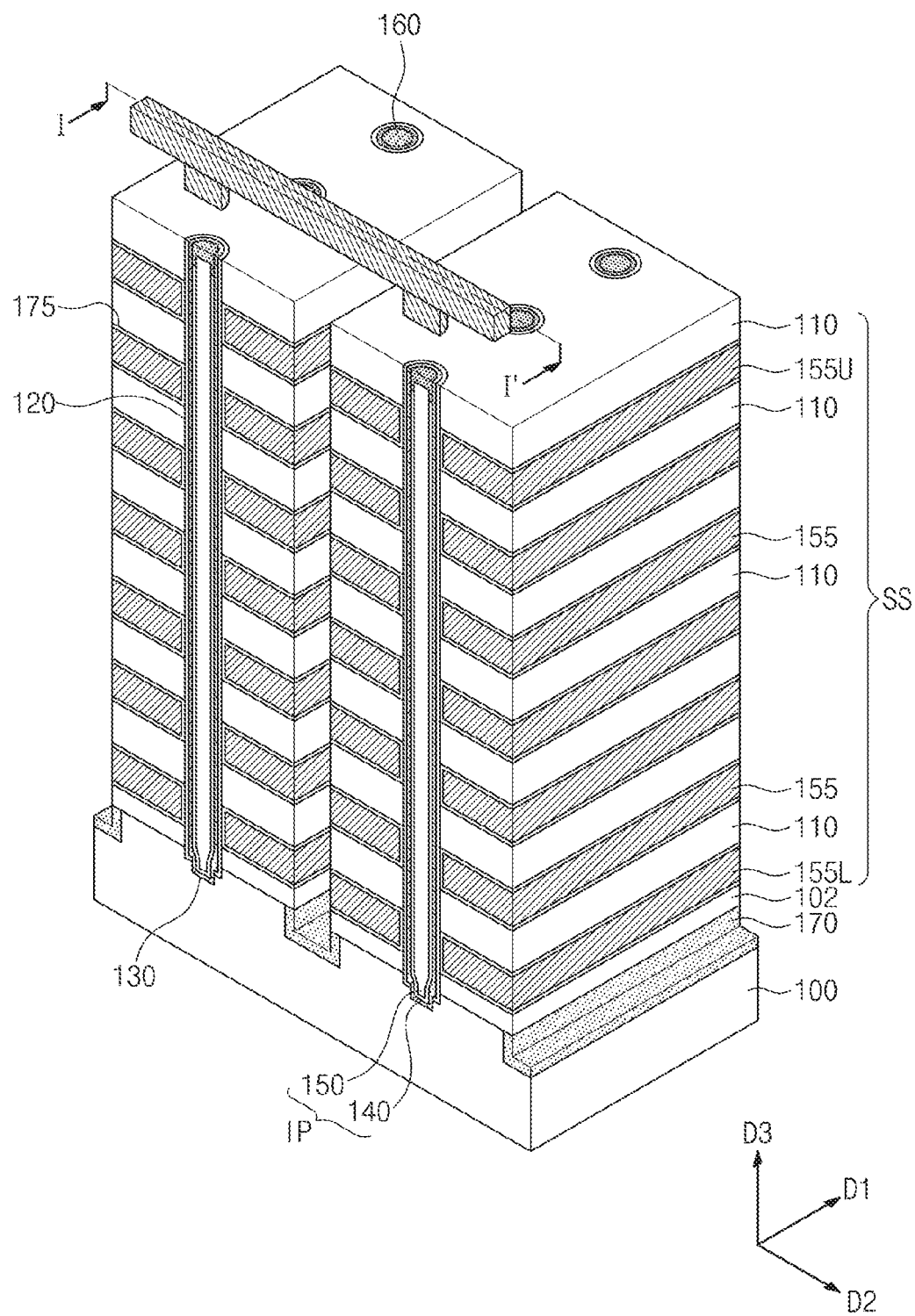
FIG. 2 is a perspective view illustrating a three-dimensional semiconductor device according to some examples of the inventive concept.
Figure 3:
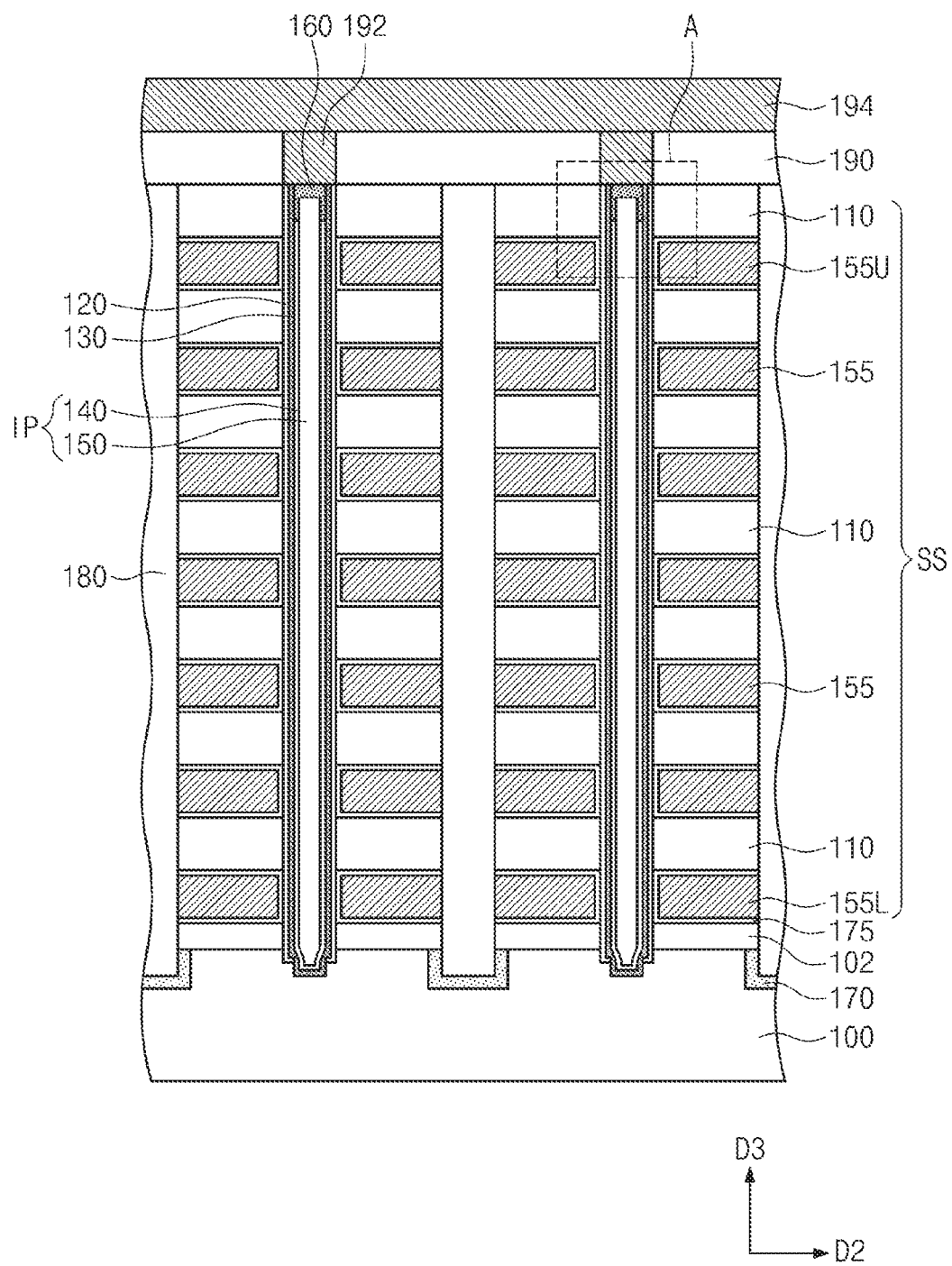
FIG. 3 is a sectional view which is taken along line I-I' of FIG. 2 to illustrate a three-dimensional semiconductor memory device according to some examples of the inventive concept.
Figure 4:
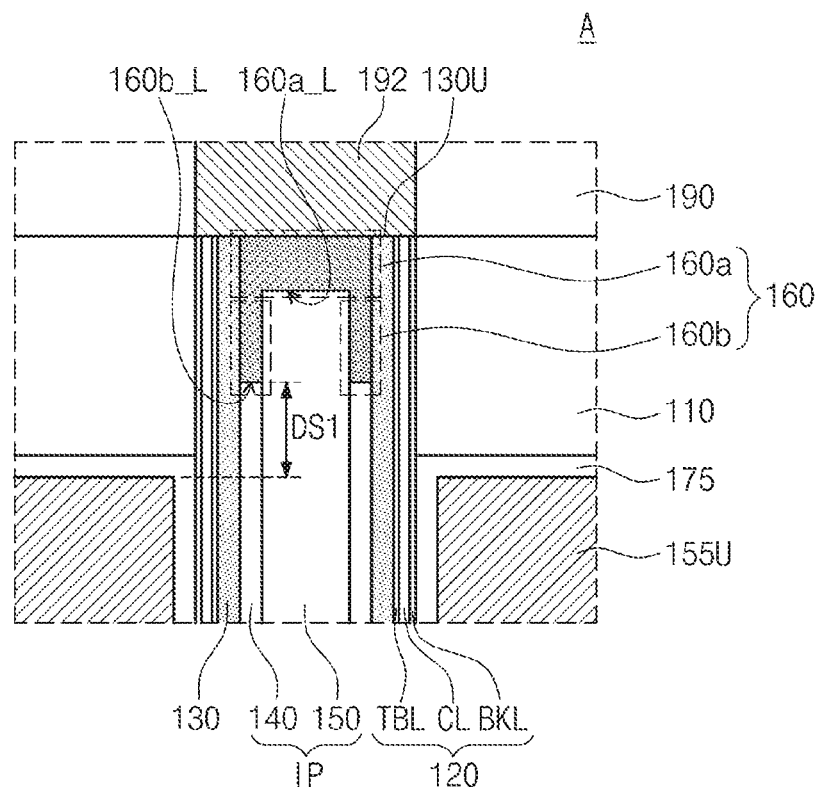
FIG. 4 is an enlarged view of a portion 'A' of FIG. 3.
Figure 5:
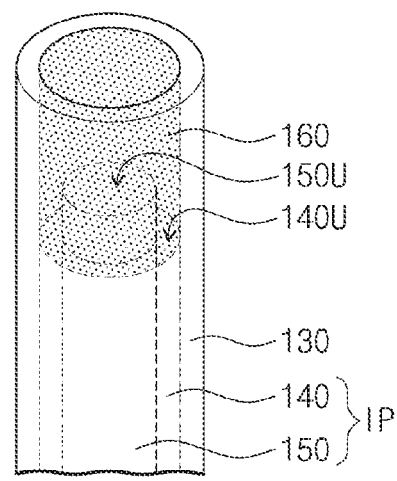
FIG. 5 is a perspective view, which is provided to correspond to the portion 'A' of FIG. 3 and to illustrate an insulating gap-fill pattern and a conductive pattern according to some examples of the inventive concept.

FIG. 2 is a perspective view illustrating a three-dimensional semiconductor device according to the inventive concept. FIG. 3 is a sectional view taken along line I-I' of FIG. 2. FIG. 4 is an enlarged view of portion 'A' of FIG. 3. FIG. 5 is a perspective view of examples of an insulating gap-fill pattern and a conductive pattern of the three-dimensional semiconductor device according to the inventive concept, corresponding to the portion 'A' of the device in FIG. 3.

Referring to FIGS. 2 and 3, a stack SS may be provided on a substrate 100. The stack SS may include a plurality of insulating layers 110 and a plurality of gate electrodes 155L, 155, and 155U, which are alternately and repeatedly stacked on the substrate 100. The substrate 100 may be, for example, a silicon wafer, a germanium wafer, or a silicon-germanium wafer. The plurality of gate electrodes 155L, 155, and 155U may include a lower gate electrode 155L on the substrate 100, an upper gate electrode 155U on the lower gate electrode 155L, and cell gate electrodes 155 interposed between the lower and upper gate electrodes 155L and 155U.

When viewed in a plan view, the stack SS may be a line-shaped structure extending parallel to a first direction D1. The gate electrodes 155L, 155, and 155U may be stacked in a third direction D3 that is not parallel to both of the first direction D1 and a second direction D2 crossing the first direction D1. The first direction D1 and the second direction D2 may be substantially parallel to a top surface of the substrate 100, and the third direction D3 may be substantially perpendicular to the top surface of the substrate 100. The gate electrodes 155L, 155, and 155U may be spaced apart from each other by the insulating layers 110 therebetween. For example, the insulating layers 110 may be formed of or include at least one layer selected from the group consisting of a silicon layer, a silicon oxide layer, a silicon carbide layer, a silicon oxynitride layer, and a silicon nitride layer. The gate electrodes 155L, 155, and 155U may be formed of or include at least one material selected from the group consisting of single-crystalline silicon, poly-crystalline silicon, metals, and a conductive metal nitrides.

A lower insulating layer 102 may be provided between the substrate 100 and the stack SS. The lower insulating layer 102 may be formed of or include at least one layer selected from the group consisting of a silicon oxide layer, a silicon nitride layer, and high-k dielectric layers (e.g., aluminum oxide, hafnium oxide, and so forth). The lower insulating layer 102 may have a thickness smaller than that of the insulating layers 110. Here, the thicknesses of the lower insulating layer 102 and the insulating layers 110 may be measured in the third direction D3.

The substrate 100 may include common source regions 170 doped with impurities. The common source regions 170 may be provided in the substrate 100 and at both sides of the stack SS. When viewed in a plan view, the common source regions 170 may be line-shaped structures extending in the first direction D1 and may be spaced apart from each other in the second direction D2.

A channel structure 130 may be provided to pass through the stack SS and may be electrically connected to the substrate 100. In some examples, a plurality of the channel structures 130 may be provided in the stack SS and may be arranged in the first direction D1, when viewed in a plan view. As an alternative to the configuration shown in FIG. 2, when viewed in a plan view, the plurality of the channel structures 130 may be arranged in a zigzag manner in the first direction D1.

Referring to FIGS. 3 to 5, the channel structure 130 may have a pipe-shaped or tubular structure. A bottom portion of the channel structure 130 may be closed. The portion of the channel structure 130 may be received in the substrate 100, and a bottom surface of the channel structure 130 may be in contact with the substrate 100. The channel structure 130 may be formed of or include a semiconductor material. As an example, the channel structure 130 may be formed of a silicon- or germanium-containing material. The channel structure 130 may be a pattern of intrinsic semiconductor material or a pattern of material doped so as to be a semiconductor. At least a portion of the channel structure 130 may have one of a single crystalline, polycrystalline, and amorphous structure.

An insulating gap-fill pattern IP may be provided to fill an inner space of the channel structure 130. For example, the insulating gap-fill pattern IP may be provided in the inner space of the channel structure 130, and in this case, it may be surrounded by the channel structure 130, when viewed in a plan view. The insulating gap-fill pattern IP may include a first insulating pattern 140 and a second insulating pattern 150. The first insulating pattern 140 may be a sheath portion of the insulating gap-fill pattern IP covering an inner surface of the channel structure 130. In particular, the first insulating pattern 140 may have a pipe-shaped or tubular structure. A bottom portion of the first insulating pattern 140 may be closed, but in certain examples, it may be open. The second insulating pattern 150 may be a core portion of the insulating gap-fill pattern IP wrapped by the sheath portion. The second insulating pattern 150 may fill an inner space of the first insulating pattern 140. That is, the second insulating pattern 150 may be a core portion around which a sheath portion formed by the first insulating pattern 140 extends, when viewed in a plan view. The second insulating pattern 150 may have the form of a pillar. A portion of the second insulating pattern 150 may be spaced apart from the channel structure 130 with the first insulating pattern 140 interposed therebetween. In the case in which the bottom portion of the first insulating pattern 140 is open, a bottom portion of the second insulating pattern 150 may be in contact with the channel structure 130, contrary to the example illustrated in the drawings. The first insulating pattern 140 may expose a side surface of the second insulating pattern 150. For example, the first insulating pattern 140 may expose a side surface of an upper portion of the second insulating pattern 150. A topmost surface 140U of the first insulating pattern 140 may be positioned at a level lower than that of a top surface 150U of the second insulating pattern 150, relative to the substrate 100. The topmost surface 140U of the first insulating pattern 140 may be positioned at a level higher than a top surface of the upper gate electrode 155U, relative to the substrate 100.

The second insulating pattern 150 may be formed of or include a material having an etch selectivity with respect to the first insulating pattern 140. The second insulating pattern 150 may be formed of or include a material that has an etch selectivity with respect to the first insulating pattern 140 or is different from the first insulating pattern 140. In certain examples, the second insulating pattern 150 may be formed of or include the same material as the first insulating pattern 140, but the first insulating pattern 140 and the second insulating pattern 150 may be different from each other in terms of their porosity. In certain examples, the second insulating pattern 150 may be formed of or include a material that is the same as that of the first insulating pattern 140 except that the material of the second insulating pattern 150 is doped with impurities. The impurities may be at least one selected from the group consisting of carbon (C), nitrogen (N), and boron (B). As examples, the first insulating pattern 140 may include silicon oxide, and the second insulating pattern 150 may include silicon oxynitride (SiON), silicon oxycarbide nitride (SiOCN), or silicon oxycarbide (SiOC).

A conductive pattern 160 may be provided on the insulating gap-fill pattern IP. The conductive pattern 160 may cap an end of the insulating gap-fill pattern IP. In this respect, the insulating gap-fill pattern IP may extend into the conductive pattern 160. In particular, part of the core portion (second insulating pattern 150) of the insulating gap-fill pattern IP may project beyond the sheath portion (first insulating pattern 140) of the insulating gap-fill pattern IP and into the conductive pattern 160 at an (upper) end of the insulating gap-fill pattern (IP).

Thus, for example, the first insulating pattern 140 may expose the side surface of the upper portion of the second insulating pattern 150, and the upper portion of the second insulating pattern 150 may be received in the conductive pattern 160. The exposed side surface of the upper portion of the second insulating pattern 150 may be covered with the conductive pattern 160. The conductive pattern 160 may cover the top surface 150U of the second insulating pattern 150 and may extend along the exposed side surface of the second insulating pattern 150, thereby being in contact with the topmost surface 140U of the first insulating pattern 140. The conductive pattern 160 may include a first portion 160a, which is located on the top surface 150U of the second insulating pattern 150, and a second portion 160b, which extends from the first portion 160a to cover the exposed side surface of the second insulating pattern 150. When viewed in a plan view, the second portion 160b may enclose the exposed side surface of the second insulating pattern 150 and may be in contact with the topmost surface 140U of the first insulating pattern 140. A bottom surface 160a_L of the first portion 160a may be located at a level higher than a bottom surface 160b_L of the second portion 160b, relative to the substrate 100.

At least a portion of the conductive pattern 160 may be provided in the inner space of the channel structure 130 and may be surrounded by the channel structure 130, when viewed in a plan view. The second portion 160b of the conductive pattern 160 may be provided between the channel structure 130 and the second insulating pattern 150. At least a portion of the second insulating pattern 150 may be spaced apart from the channel structure 130 with the second portion 160b of the conductive pattern 160 interposed therebetween. A topmost surface 130U of the channel structure 130 may be positioned at a level higher than the top surface 150U of the second insulating pattern 150, relative to the substrate 100. In some examples, a top surface of the conductive pattern 160 may be coplanar with the topmost surface 130U of the channel structure 130. The conductive pattern 160 may be formed of or include a doped semiconductor material and/or an intrinsically conductive material.

As the distance DS1 between the upper gate electrode 155U and the conductive pattern 160 increases, electric resistance of the channel structure 130 may increase.

According to some examples of the inventive concept, the bottom surface 160b_L of the second portion 160b of the conductive pattern 160 may be positioned at a level lower than the bottom surface 160a_L of the first portion 160a of the conductive pattern 160, relative to the substrate 100, and thus, the distance DS1 between the upper gate electrode 155U and the conductive pattern 160 may be minimized. As a result, the electric resistance of the channel structure 130 may be suppressed.

A vertical insulator 120 may be interposed between the stack SS and the channel structure 130. The vertical insulator 120 may be interposed between each of the plurality of gate electrodes 155L, 155, and 155U and the channel structure. In some examples, the vertical insulator 120 may extend into a region between each of the plurality of insulating layers 110 and the channel structure. The vertical insulator 120 may be a pipe-shaped or tubular structure with open top and bottom. The vertical insulator 120 may have a bottom surface that is in contact with the substrate 100.

Referring to FIG. 4, the vertical insulator 120 may include a memory element for a FLASH memory device. In other words, the vertical insulator 120 may include a charge storing layer CL, which is used as the memory element of the FLASH memory device. Data stored in the vertical insulator 120 may be changed using a Fowler-Nordheim (FN) tunneling effect, which may be caused by a difference in voltage between the channel structure 130 and the gate electrodes 155L, 155, and 155U adjacent thereto. Alternatively, the vertical insulator 120 may include a layer (e.g., a phase-changeable layer or a variable resistance layer) whose data can be changed using another physical effect. The vertical insulator 120 may further include a tunnel insulating layer TBL stacked on the charge storing layer CL. The tunnel insulating layer TBL may be contact the channel structure 130, and the charge storing layer CL may be interposed between the tunnel insulating layer TBL and the gate electrodes 155L, 155, and 155U. In some examples, the vertical insulator 120 may further include a blocking insulating layer BKL interposed between the charge storing layer CL and the gate electrodes 155L, 155, and 155U. The charge storing layer CL may be formed of or include at least one layer selected from the group consisting of a silicon nitride layer, a silicon oxynitride layer, a silicon-rich nitride layer, a nano-crystalline silicon layer, or a laminated trap layer. The tunnel insulating layer TBL may include a material whose band gap is greater than that of the charge storing layer CL. For example, the tunnel insulating layer TBL may be a silicon oxide layer. The blocking insulating layer BKL may include a material whose band gap is greater than that of the charge storing layer CL. For example, the blocking insulating layer BKL may be or include at least one layer selected from the group consisting of a silicon oxide layer, a silicon nitride layer, and a silicon oxynitride layer. Although not shown, the vertical insulator 120 may further include a capping layer interposed between the channel structure 130 and the insulating layers 110. The capping layer may contact the insulating layers 110 and may include a plurality of patterns that are vertically divided by the gate electrodes 155L, 155, and 155U. In certain examples, the capping layer may extend vertically in a region between the channel structure 130 and the gate electrodes 155L, 155, and 155U adjacent thereto. The capping layer may be formed of or include an insulating material that has an etch selectivity with respect to the charge storing layer CL and is different from that of the insulating layers 110. In some examples, the capping layer may be formed of or include at least one material selected from the group consisting of silicon, silicon oxide, poly silicon, silicon carbide, and silicon nitride but is different from that of the insulating layers 110. In certain examples, the capping layer may be formed of or include at least one high-k dielectric material (e.g., tantalum oxide ($Ta_2O_5$), titanium oxide ($TiO_2$), hafnium oxide ($HfO_2$), zirconium oxide ($ZrO_2$), etc.).

Referring back to FIGS. 2 and 3, horizontal insulators 175 may be provided to cover top and bottom surfaces of each of the gate electrodes 155L, 155, and 155U. Each of the horizontal insulators 175 may extend between each of the gate electrodes 155L, 155, and 155U and the vertical insulator 120. Each horizontal insulator 175 may consist of a single layer or a plurality of layers. In some examples, the horizontal insulators 175 may be used as a blocking insulating layer of a charge-trap FLASH memory transistor.

Electrode separation patterns 180 may be provided at both sides of the stack SS. The electrode separation patterns 180 may cover the common source regions 170. The electrode separation patterns 180 may be formed of or include at least one layer selected from the group consisting of a silicon oxide layer, a silicon nitride layer, and a silicon oxynitride layer. An interconnection line 194 may be provided on the stack SS to cross the stack SS. The interconnection line 194 may be coupled to the conductive pattern 160 through a contact plug 192 and may be spaced apart from the stack SS by an interlayer insulating layer 190.

FIGS. 6 through 14 are sectional views which illustrate examples of a method of fabricating a three-dimensional semiconductor device according to the inventive concept. FIG. 15 is an enlarged view of a portion 'B' of FIG. 11.

Figure 6:
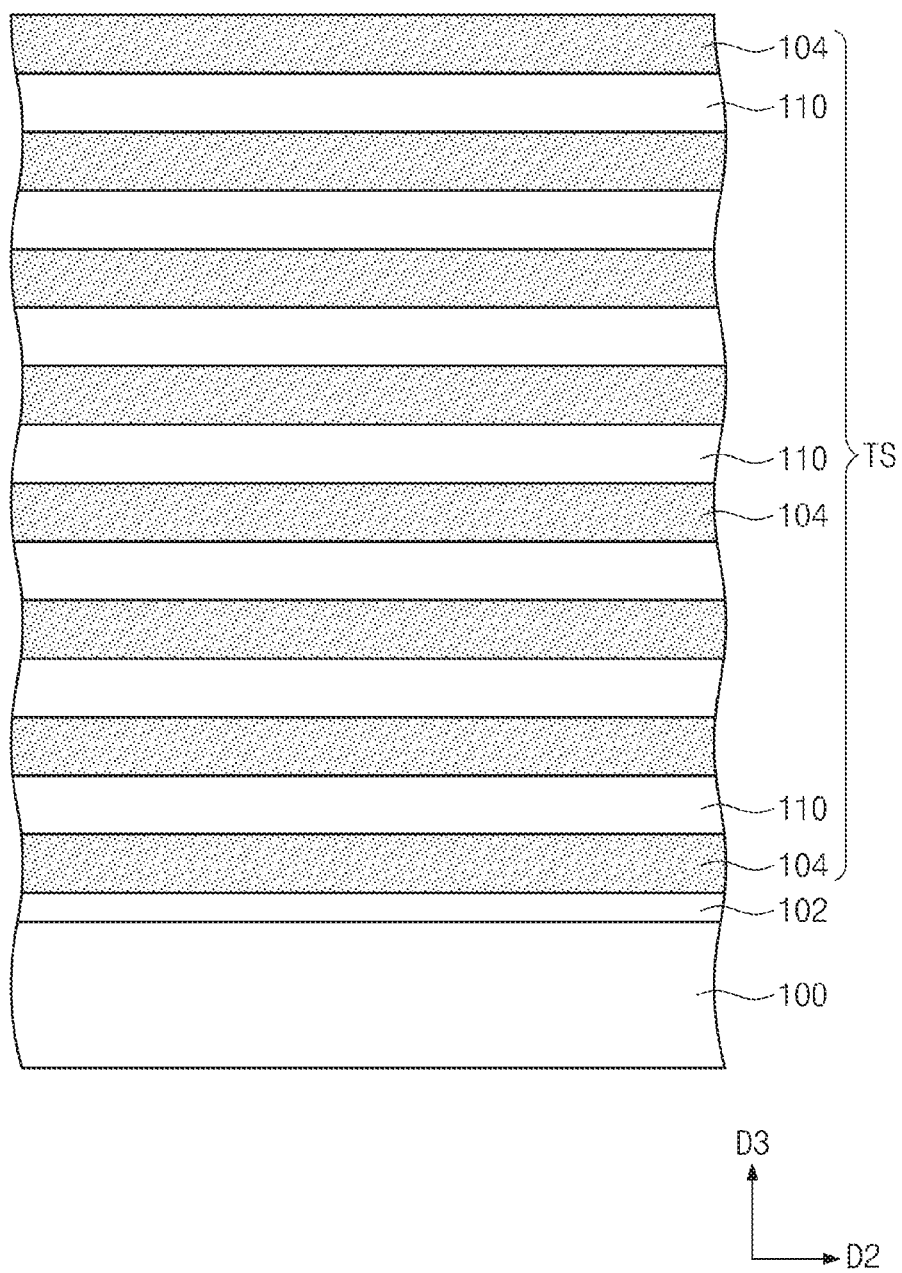
FIGS. 6, 7, 8, 9, 10, 11, 12, 13 and 14 are sectional views of a three-dimensional semiconductor device during the course of its manufacture, taken in a direction corresponding to that of line I-I' of FIG. 2, and together illustrating some examples of a method of fabricating a three-dimensional semiconductor device according to the inventive concept.

Referring to FIG. 6, the lower insulating layer 102 may be formed on the substrate 100. The substrate 100 may be, for example, a silicon wafer, a germanium wafer, or a silicon-germanium wafer. In this example, the lower insulating layer 102 is a silicon oxide layer, which is formed by a thermal oxidation process or a deposition process.

A layered structure TS may be formed on the lower insulating layer 102, and in some examples, the layered structure TS may include sacrificial layers 104 and insulating layers 110, which are alternately and repeatedly deposited on the lower insulating layer 102. In some examples, the sacrificial layers 104 may be formed to have the same thicknesses. In certain examples, the lowermost one of the sacrificial layers 104 may be formed to be thicker than the others thereon. In certain examples, the second uppermost one of the sacrificial layers 104 may be formed to be thicker than the others thereunder. The insulating layers 110 may be formed to have the same thicknesses, but in certain examples, the lowermost one of the insulating layers 110 may be formed to be thicker than the others thereon. The lower insulating layer 102 may be formed to be thinner than the sacrificial layers 104 and the insulating layers 110 thereon.

The sacrificial layers 104 and the insulating layers 110 may be formed by, for example, a thermal CVD process, a plasma-enhanced CVD process, a physical CVD process, or an atomic layer deposition (ALD) process. In some examples, the sacrificial layers 104 and the insulating layers 110 are formed of or include different materials having different etch selectivity properties. As examples, each of the sacrificial layers 104 may be formed of at least one layer of material selected from the group consisting of a silicon layer, a silicon oxide layer, a silicon carbide layer, a silicon oxynitride layer, and a silicon nitride layer. The insulating layers 110 may be formed at least one layer of material selected from the group consisting of a silicon layer, a silicon oxide layer, a silicon carbide layer, a silicon oxynitride layer, and a silicon nitride layer, but of material different overall from that of the sacrificial layers 104. As an example, the sacrificial layers 104 may be formed of silicon nitride, and the insulating layers 110 may be formed of silicon oxide. However, in certain examples, the sacrificial layers 104 may be formed of a conductive material, and the insulating layers 110 may be formed of an insulating material.

Figure 7:
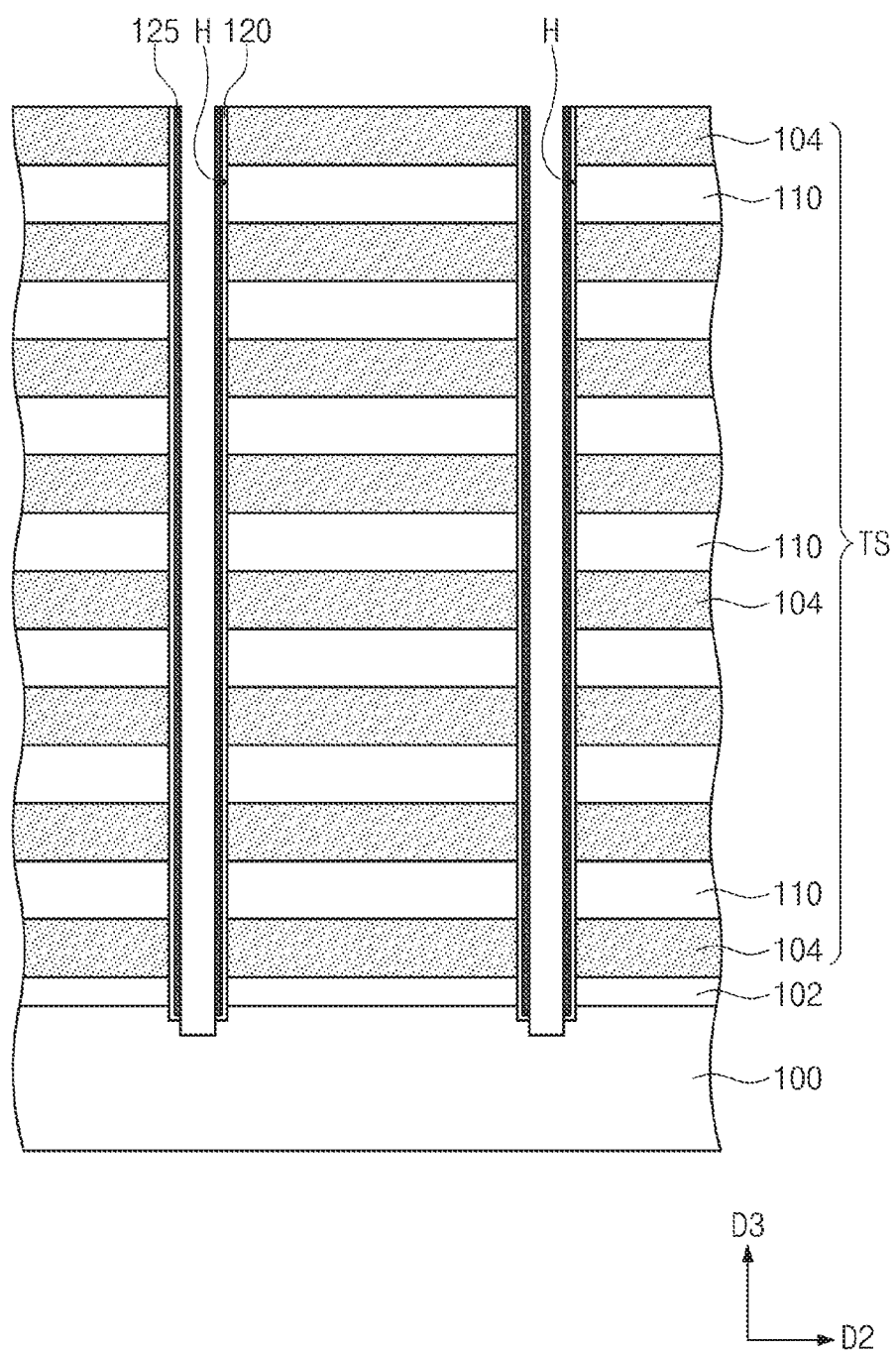

Referring to FIG. 7, through holes H may be formed through the layered structure TS to expose the substrate 100. A plurality of the through holes H may be formed in the layered structure TS and may be arranged in the first direction D1, when viewed in a plan view. In some examples, the through holes H may be arranged in a zigzag manner in the first direction D1. The forming of the through hole H may include forming a first mask pattern (not shown), having an opening defining a position and a shape of the through hole H, on the layered structure TS, and anisotropically etching the layered structure TS using the first mask pattern as an etch mask. The first mask pattern may be formed of or include a material that is selected to have an etch selectivity with respect to the sacrificial layers 104 and the insulating layers 110. The etching process may be performed to over-etch the substrate 100, i.e., to etch the top surface of the substrate 100. Thus, an upper portion of the substrate 100 may be recessed. In any case, the through hole H may be formed to expose at least a portion of the substrate 100.

A vertical insulator 120 may be formed to cover an inner surface defining the through hole H and to expose the substrate 100. The forming of the vertical insulator 120 may include sequentially forming a vertical insulating layer and a spacer layer on the layered structure TS to cover the inner surface defining the through hole H, anisotropically etching the spacer layer to form a spacer pattern 125 on the inner surface defining the through hole H, and anisotropically etching the vertical insulating layer using the spacer pattern 125 as an etch mask. The spacer layer may be formed of or include a material that is selected to have an etch selectivity with respect to the vertical insulating layer. The spacer layer may be formed of or include a semiconductor layer (e.g., a poly silicon layer, a single crystalline silicon layer, or an amorphous silicon layer). The spacer pattern 125 may be formed to have a pipe-shaped or tubular structure with open top and bottom. The anisotropic etching of the vertical insulating layer may be performed to expose a top surface of the layered structure TS and to recess the upper portion of the substrate 100 exposed by the through hole H. Because the spacer pattern 125 is used as an etch mask during the anisotropic etching of the vertical insulating layer, a portion of the vertical insulating layer under the spacer pattern 125 may not be etched. The vertical insulator 120 may be formed to have a pipe-shaped or tubular structure with an open top and open bottom. The vertical insulator 120 and the spacer pattern 125 may be locally formed in the through hole H.

The vertical insulator 120 may include a blocking insulating layer BKL, a charge storing layer CL, and a tunnel insulating layer TBL which are stacked sequentially, as described with reference to FIG. 4. The blocking insulating layer BKL may cover side surfaces of the sacrificial layers 104 and the insulating layers 110 exposed by the through hole H. The blocking insulating layer BKL may be formed of or include a silicon oxide layer, for example. The charge storing layer CL may include a trap insulating layer or an insulating layer with conductive nano dots. For example, the charge storing layer CL may include at least one of a silicon nitride layer, a silicon oxynitride layer, a silicon-rich nitride layer, a nano-crystalline silicon layer, and a laminated trap layer. The tunnel insulating layer TBL may be formed of or include at least one material whose band gap is greater than that of the charge storing layer CL. For example, the tunnel insulating layer TL may be a silicon oxide layer.

Figure 8:
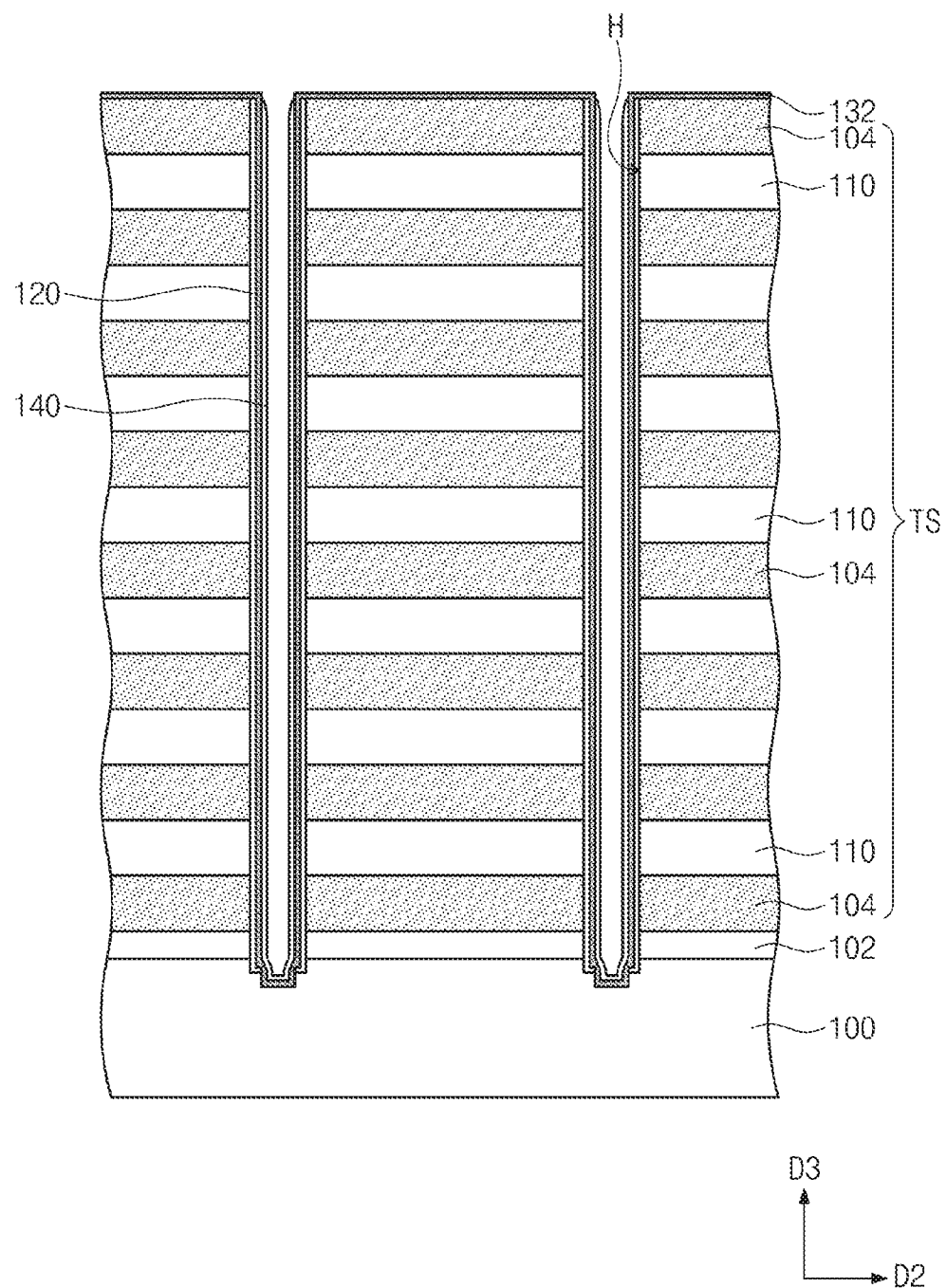

Referring to FIG. 8, the spacer pattern 125 may be removed, after the vertical insulator 120 has been formed. For example, the removing of the spacer pattern 125 may be performed using an etch process having an etch selectivity with respect to the sacrificial layers 104 and the vertical insulator 120. After the spacer pattern 125 has been removed, a channel layer 132 may be formed on the layered structure TS to cover the inner surface defining the through hole H. The channel layer 132 may be formed to conformally cover the inner surface defining the through hole H but to have a thickness that is too thin to fill the entirety of the through hole H. The channel layer 132 may be in contact with a portion of the substrate 100 exposed by the vertical insulator 120. The vertical insulator 120 may be interposed between the inner surface of the through hole H and the channel layer 132. The channel layer 132 may be a semiconductor material (e.g., a poly-crystalline silicon layer, a single-crystalline silicon layer, or an amorphous silicon layer), which is formed by an ALD or CVD technique.

A first insulating pattern 140 may be formed in the through hole H. The forming of the first insulating pattern 140 may include forming a first insulating layer on the layered structure TS to cover the inner surface defining the through hole H and then partially etching the first insulating layer to expose the top surface of the layered structure TS. The first insulating layer may be formed along the inner surface defining the through hole H but may have a thickness that is too thin to fully fill the remaining space of the through hole H. As a result of the etching process on the first insulating layer, the first insulating pattern 140 may be locally formed in the through hole H, and an upper portion of the first insulating pattern 140 may have a shape tapered toward the top surface of the layered structure TS. In the through hole H, the first insulating pattern 140 may be formed to have a pipe-shaped or tubular structure with closed bottom or a cup-shaped structure. In some examples, the first insulating pattern 140 in the through hole H may be formed to have a pipe-shaped or tubular structure with open top and bottom, unlike that illustrated in FIG. 8. The first insulating pattern 140 may be in contact with the channel layer 132. The channel layer 132 may be interposed between the inner surface defining the through hole H and the first insulating pattern 140.

Figure 9:
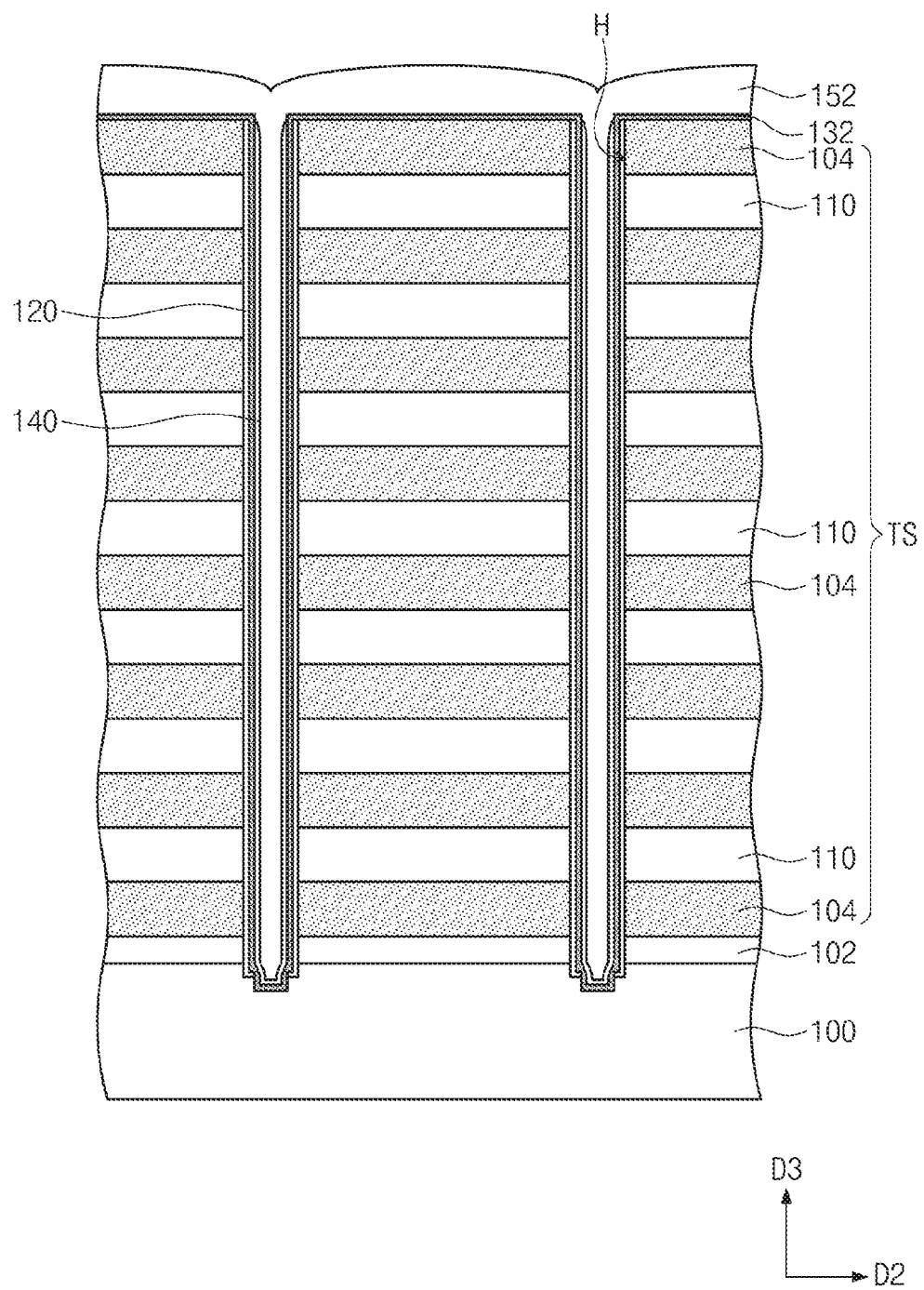

Referring to FIG. 9, a second insulating layer 152 may be formed on the layered structure TS to fill the through hole H. The second insulating layer 152 may include a material having an etch selectivity with respect to the first insulating pattern 140. The second insulating layer 152 may be formed of or include a material that has an etch selectivity with respect to the first insulating pattern 140 or is different from the first insulating pattern 140. In certain examples, the second insulating layer 152 may be formed of or include the same material as the first insulating pattern 140, but the first insulating pattern 140 and the second insulating layer 152 may be different from each other in terms of their porosity. In certain examples, the second insulating layer 152 may be formed of or include a material that is the same as that of the first insulating pattern 140 but is doped with impurities. The impurities may be at least one of carbon (C), nitrogen (N), and boron (B). As an example, the first insulating pattern 140 may include silicon oxide, and the second insulating layer 152 may include silicon oxynitride (SiON), silicon oxycarbide nitride (SiOCN), silicon oxycarbide (SiOC), or the like.

Figure 10:
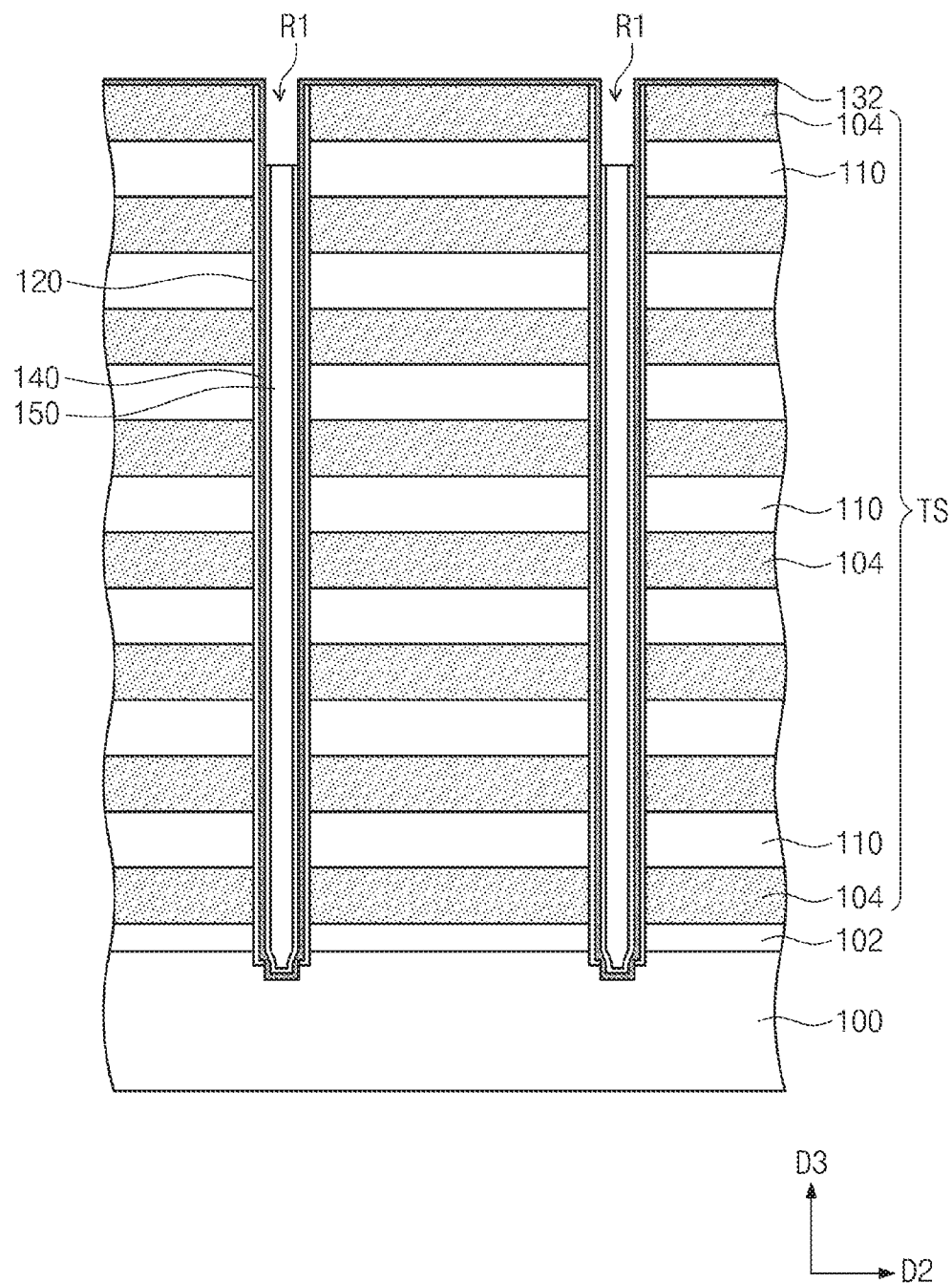

Referring to FIG. 10, the second insulating layer 152 may be planarized to form a second insulating pattern 150 in the through hole H. The planarization process may be performed to expose the channel layer 132 on the top surface of the layered structure TS. As a result of the planarization process, a first recess region R1 may be formed to partially expose the channel layer 132 within the through hole H. For example, during the planarization process, the first insulating pattern 140 in the through hole H may be partially removed to form the first recess region R1. A bottom of the first recess region R1 may be positioned at a level between top and bottom surfaces of the uppermost one of the insulating layers 110, relative to the substrate 100. The first recess region R1 may be formed to expose the topmost surface of the first insulating pattern 140 and a top surface of the second insulating pattern 150. The second insulating pattern 150 may be locally formed in the through hole H. The second insulating pattern 150 may be provided in the inner space of the first insulating pattern 140 and may be surrounded by the first insulating pattern 140, when viewed in a plan view. At least a portion of the second insulating pattern 150 may be spaced apart from the channel layer 132 with the first insulating pattern 140 interposed therebetween. In certain examples, the second insulating pattern 150 may be formed to have a bottom portion that is in contact with the channel layer 132, unlike that illustrated in FIG. 10.

Figure 11:
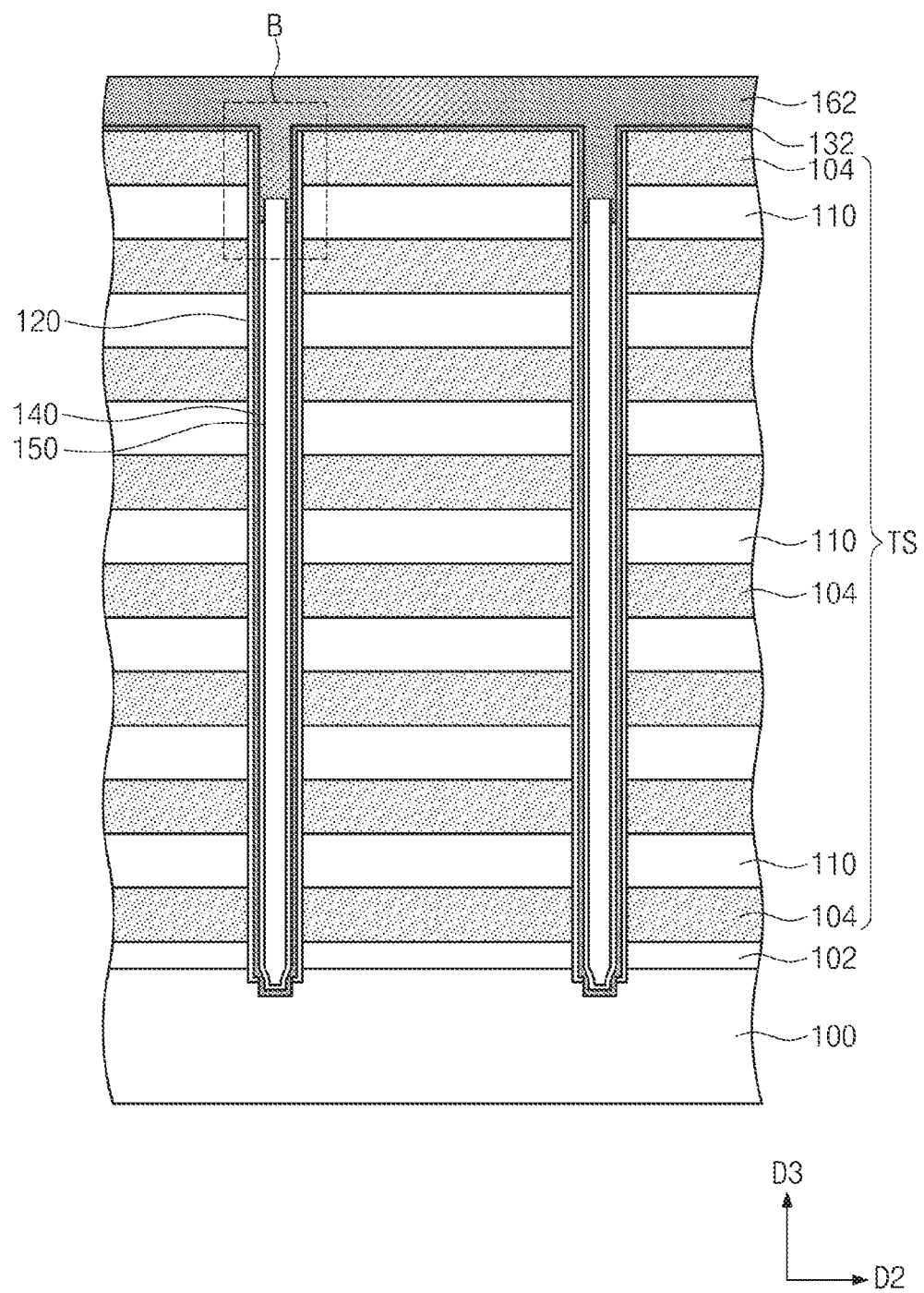

Referring to FIG. 11, a portion of the first insulating pattern 140 exposed by the first recess region R1 may be selectively removed. Accordingly, a side surface of a portion of the second insulating pattern 150 may be exposed. The partial and selective removing of the first insulating pattern 140 may be performed by an etching process using an etch process having an etch selectivity with respect to the second insulating pattern 150. As an example, the selective etching process may be an isotropic etching process that is performed using an etch selectivity with respect to the second insulating pattern 150. In the case in which the first insulating pattern 140 includes silicon oxide and the second insulating pattern 150 includes silicon oxynitride (SiON), silicon oxycarbide nitride (SiOCN), silicon oxycarbide (SiOC) or the like, the selective etching process may include a wet etching process, in which hydrogen fluoride (HF) is used. Because the first insulating pattern 140 is partially and selectively removed, the topmost surface of the first insulating pattern 140 may be positioned at a level lower than the top surface of the second insulating pattern 150, relative to the substrate 100.

Subsequently, a conductive layer 162 may be formed on the layered structure TS to fill the first recess region R1. The conductive layer 162 may be formed to cover the top surface of the second insulating pattern 150. The conductive layer 162 may extend along the exposed side surface of the second insulating pattern 150 to cover the topmost surface of the first insulating pattern 140. The conductive layer 162 may be formed of or include a doped semiconductor material and/or a conductive material.

In some examples, as shown in FIG. 15, a preliminary conductive layer 164 may be formed to cover the exposed side surface of the second insulating pattern 150, before the conductive layer 162 has been formed. The preliminary conductive layer 164 may be formed by a deposition process having a relatively high step coverage property. The preliminary conductive layer 164 may be formed to fill a space SP between the exposed side surface of the second insulating pattern 150 and the channel layer 132. As an example, the forming of the preliminary conductive layer 164 may include depositing an intrinsic semiconductor layer and doping the intrinsic semiconductor layer with impurities, and here, the doping process may be performed after or during the process of depositing the intrinsic semiconductor layer. The impurities may be phosphorus (P), boron (B), and so forth. In some examples, although not shown, the preliminary conductive layer 164 may be partially removed by an etching process, and thus, the preliminary conductive layer 164 may remain locally in the space SP. After the preliminary conductive layer 164 has been formed, the conductive layer 162 may be formed on the layered structure TS to fill the first recess region R1, as described with reference to FIG. 11. In certain examples, the forming of the preliminary conductive layer 164 may be omitted.

Figure 12:
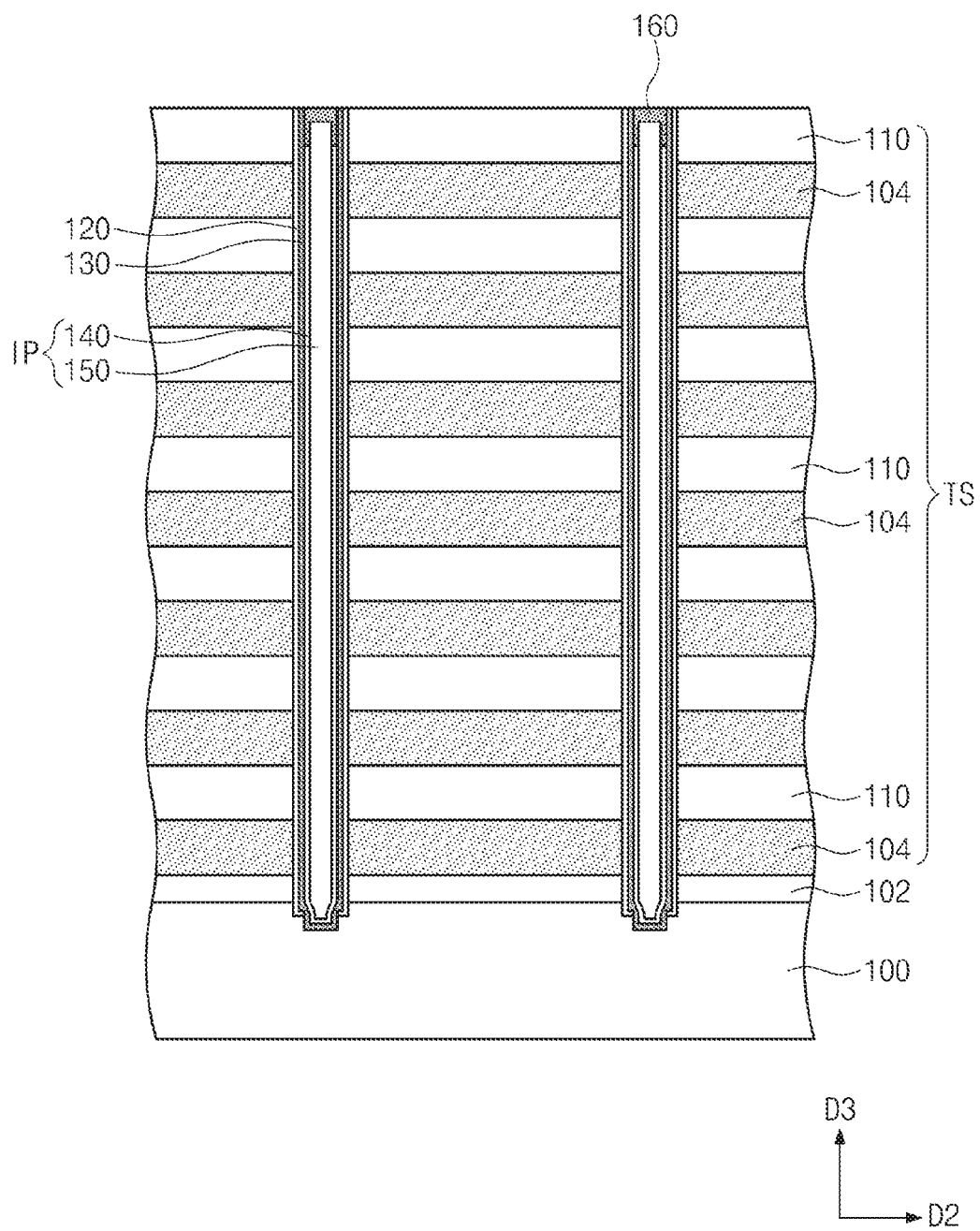

Referring to FIG. 12, a planarization process may be performed on the conductive layer 162 to form a conductive pattern 160 in the first recess region R1. The planarization process may be performed to expose a top surface of the uppermost one of the insulating layers 110. Also, the planarization process may be performed to remove the channel layer 132 from the top surface of the layered structure TS, and thus, a channel structure 130 may be locally formed in the through hole H. As a result of the planarization process, the conductive pattern 160 may have a top surface that is substantially coplanar with the topmost surface of the channel structure 130, the topmost surface of the vertical insulator 120, and the top surface of the uppermost insulating layer 110. In some examples, the first insulating pattern 140 and the second insulating pattern 150 may constitute an insulating gap-fill pattern IP. The conductive pattern 160 may be provided on the insulating gap-fill pattern IP, and at least a portion of the second insulating pattern 150 may extend into the conductive pattern 160. The channel structure 130 may surround the conductive pattern 160 and the insulating gap-fill pattern IP.

The conductive pattern 160 may include a first portion 160a, which is provided on the top surface 150U of the second insulating pattern 150, and a second portion 160b, which extends from the first portion 160a along a side surface of the second insulating pattern 150, as shown in FIG. 4. A bottom surface 160a_L of the first portion 160a may be positioned at a level higher than a bottom surface 160b_L of the second portion 160b, relative to the substrate 100. A thickness of the second portion 160b may be controlled by changing a deposition thickness of the first insulating layer, which is provided to form the first insulating pattern 140 described with reference to FIG. 8. For example, the larger the deposition thickness of the first insulating layer, the larger the thickness of the second portion 160b. Here, the thickness of the second portion 160b may be measured in a direction parallel to the top surface of the substrate 100. A length of the second portion 160b may be controlled by changing an etching amount in the selective etching process described with reference to FIG. 11. The greater the etching amount of the selective etching process, the larger the length of the second portion 160b extending along the side surface of the second insulating pattern 150.

Here, the length of the second portion 160b may be measured in a direction normal to the top surface of the substrate 100.

Figure 13:
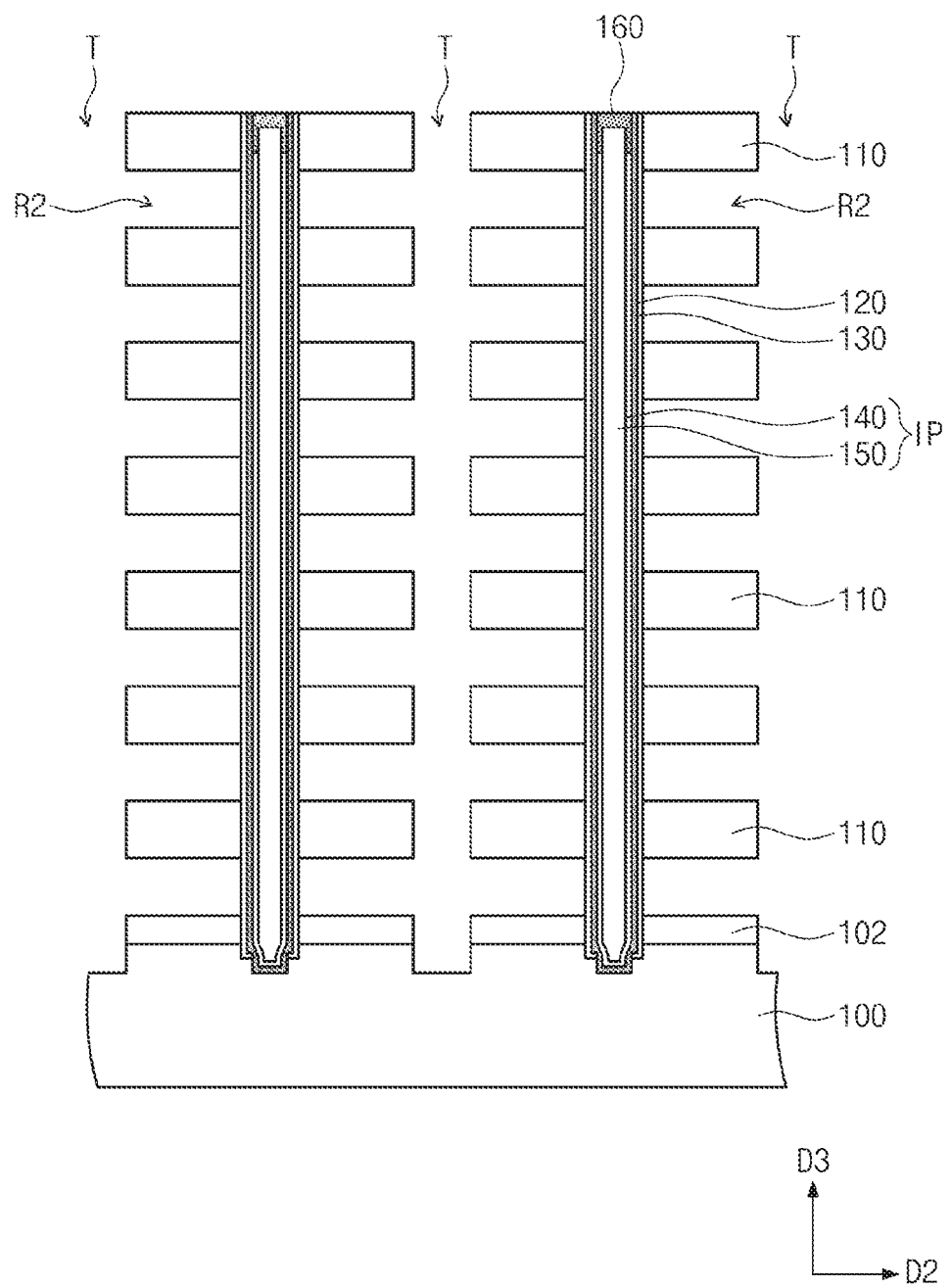

Referring to FIG. 13, the layered structure TS may be patterned to form a trench T which is spaced apart from the channel structure 130 and exposes the substrate 100. The forming of the trench T may include forming a second mask pattern (not shown), which defines a position and a shape of the trench T, on the layered structure TS, and then, anisotropically etching the layered structure TS using the second mask pattern as an etch mask. The trench T may be formed to expose side surfaces of the sacrificial and insulating layers 104 and 110. The trench T may be formed to have a line or rectangular shape, when viewed in a plan view, and to expose the top surface of the substrate 100. The substrate 100 may be over-etched or recessed during the etching process for forming the trench T. The width of the trench T may vary in a direction away from the substrate 100. For example, a lower portion of the trench T may be narrower than an upper portion of the trench T. As a result of the forming of the trench T, the layered structure TS may have a line shape. In some examples, a plurality of the channel structures 130 may be formed through each of the line-shape layered structure TS.

The sacrificial layers 104 exposed by the trench T may be removed to form second recess regions R2 between the insulating layers 110. For example, the second recess regions R2 may be formed by isotropically etching the sacrificial layers 104 using an etch process having an etch selectivity with respect to the insulating layers 110, the vertical insulator 120, the lower insulating layer 102, and the substrate 100. The isotropic etching process may be performed to completely remove the sacrificial layers 104. For example, in the case in which the sacrificial layers 104 is a silicon nitride layer and the insulating layers 110 is a silicon oxide layer, the etching process may be performed using an etching solution containing phosphoric acid.

The second recess regions R2 may be located between the insulating layers 110 to partially expose a side surface of the vertical insulator 120 and may be contiguous with or open to the trench T in a horizontal direction. That is, each of the second recess regions R2 may have a shape that is defined by vertically-adjacent ones of the insulating layers 110 and the side surface of the vertical insulator 120.

Figure 14:
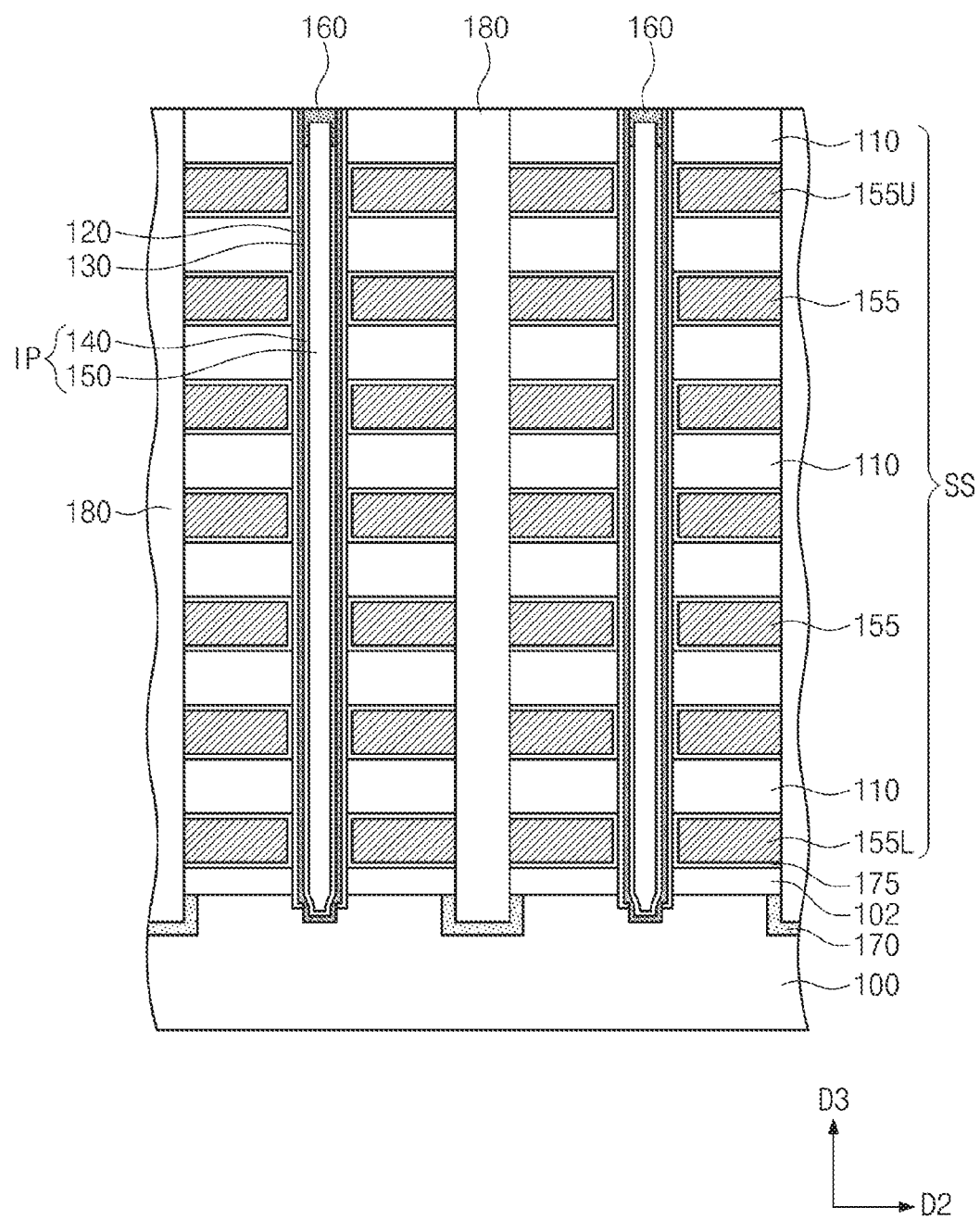
Figure 15:
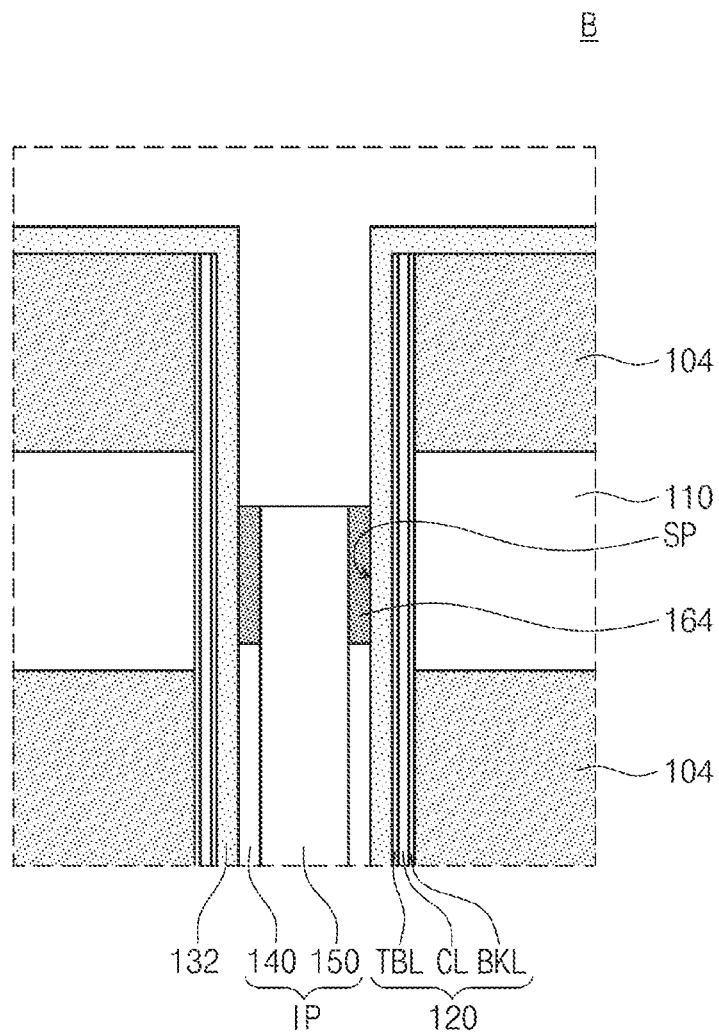
FIG. 15 is an enlarged view of a portion 'B' of FIG. 11.

Referring to FIG. 14, horizontal insulators 175 may be formed to cover inner surfaces defining the second recess regions R2, and then, gate electrodes 155L, 155, and 155U may be formed to fill the remaining spaces of the second recess regions R2. The forming of the horizontal insulators 175 and the gate electrodes 155L, 155, and 155U may include sequentially forming a horizontal insulating layer and a conductive layer in the second recess regions R2 and removing the horizontal insulating layer and the conductive layer from the trench T, and thus, the horizontal insulators 175 and the gate electrodes 155L, 155, and 155U may be locally formed in the second recess regions R2.

The horizontal insulating layer may consist of a single layer or a plurality of layers, similar to the vertical insulating layer. In some examples, the horizontal insulating layer may be used as (or include) a blocking insulating layer of a charge-trap FLASH memory transistor. The blocking insulating layer may be formed of or include material whose band gaps is smaller than that of the tunnel insulating layer TBL of FIG. 4 and are larger than that of the charge storing layer CL of FIG. 4. As an example, the blocking insulating layer may be formed of or include a high-k dielectric material (e.g., aluminum oxide or hafnium oxide). The conductive layer may be formed to fill the second recess regions R2 and to conformally cover the surface defining the trench T. In this case, the forming of the gate electrodes 155L, 155, and 155U may include removing the conductive layer from the trench T using an isotropic etching method. In certain examples, the conductive layer may be formed to fill the trench T, and in this case, the gate electrodes 155L, 155, and 155U may be formed by removing the conductive layer from the trench T using an anisotropic etching method. In some examples, the forming of the conductive layer may include sequentially depositing a metal barrier layer and a metal layer. The metal barrier layer may be formed of or include a metal nitride layer (e.g., TiN, TaN, or WN), and the metal layer may be formed of or include a metallic material (e.g., W, Al, Ti, Ta, Co, or Cu). In the second recess regions R2, the horizontal insulators 175 may contact the vertical insulator 120.

The gate electrodes 155L, 155, and 155U may include a lower gate electrode 155L on the substrate 100, an upper gate electrode 155U on the lower gate electrode 155L, and cell gate electrodes 155 stacked therebetween. Hereinafter, the insulating layers 110 and the gate electrodes 155L, 155, and 155U, which are alternately and repeatedly stacked on the substrate 100, will be referred to as a 'stack SS'.

A common source region 170 may be formed in the substrate 100. The common source region 170 may be formed by performing an ion implantation process on the substrate 100 exposed by the trench T. The common source region 170 may have a conductivity type different from that of the substrate 100. In some examples, the common source region 170 may include a plurality of regions that are electrically connected to each other and are in an equipotential state. In certain examples, the common source region 170 may include a plurality of regions that are electrically separated from each other to allow them to have electric potentials different from each other. An electrode separation pattern 180 may be formed on the common source region 170 to fill the trench T. The electrode separation pattern 180 may be formed of or include at least one layer selected from the group consisting of a silicon oxide layer, a silicon nitride layer, and a silicon oxynitride layer.

Referring back to FIG. 3, a contact plug 192 and an interconnection line 194 may be formed on the stack SS. The contact plug 192 may be connected to the conductive pattern 160, and the interconnection line 194 may be connected to the contact plug 192. The interconnection line 194 may be electrically connected to the channel structure 130 through the contact plug 192. The interconnection line 194 may be formed to cross the stack SS. The interconnection line 194 may be spaced apart from the stack SS by an interlayered insulating layer 190.

Figure 16:
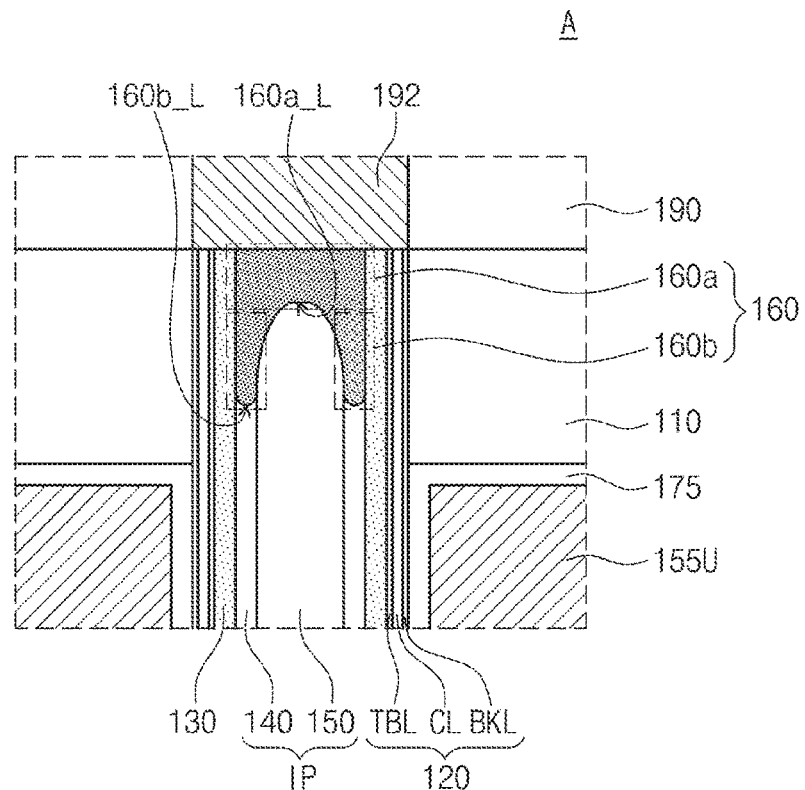
FIG. 16 is an enlarged sectional view, which is provided to correspond to the portion 'A' of FIG. 3 and to illustrate an example of a three-dimensional semiconductor device according to some examples of the inventive concept.

FIG. 16 is an enlarged sectional view of a portion, corresponding to the portion 'A' of FIG. 3, of another example of three-dimensional semiconductor device according to the inventive concept. For brevity, i.e., to avoid the necessity of repeating the detailed description of elements previously described with reference to FIGS. 2 to 5, each of such elements may be identified by a similar or identical reference number.

Referring to FIG. 16, the bottom surface of the conductive pattern 160 may have a curved shape. The second portion 160b of the conductive pattern 160 may taper toward the substrate 100, and the bottom surface 160b_L of the second portion 160b may be a rounded or convex surface protruding toward the substrate 100. The bottom surface 160a_L of the first portion 160a may be a rounded or concave surface defining an inner space of the conductive pattern 160. The bottom surface 160a_L of the first portion 160a may be positioned at a level higher than that of the bottom surface 160b_L of the second portion 160b, relative to the substrate 100.

The curved shape of the bottom surface of the conductive pattern 160 may result from the fact that the isotropic etching process described with reference to FIG. 11 has an etch selectivity with respect to the second insulating pattern 150.

Figure 17:
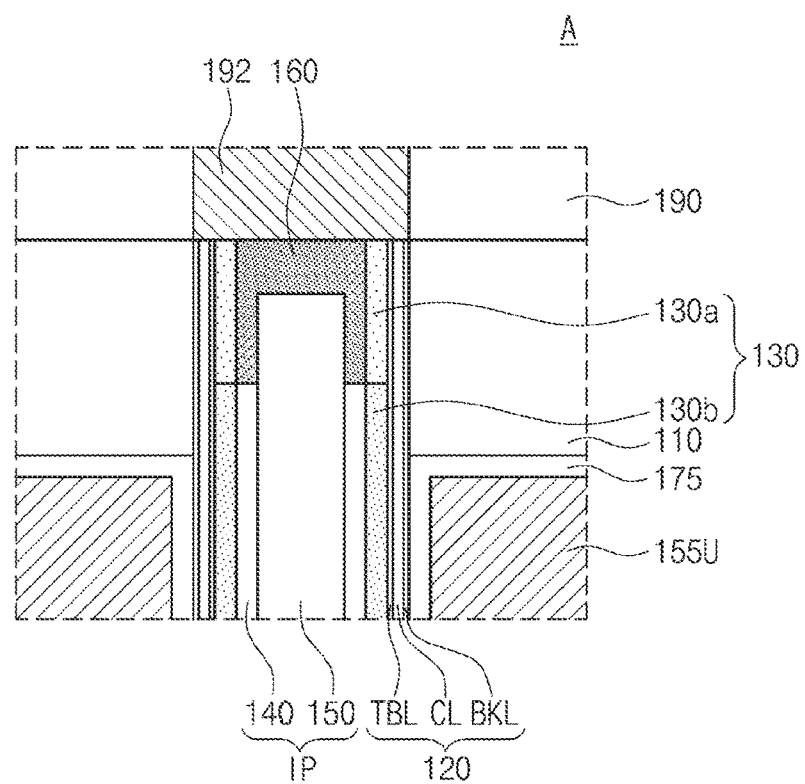
FIG. 17 is an enlarged sectional view, which is provided to correspond to the portion 'A' of FIG. 3 and to illustrate another example of a three-dimensional semiconductor device according to some examples of the inventive concept.

FIG. 17 is an enlarged sectional view of a portion, corresponding to the portion 'A' of FIG. 3, of another example of three-dimensional semiconductor device according to the inventive concept. For brevity, i.e., to avoid the necessity of repeating the detailed description of elements previously described with reference to FIGS. 2 to 5, each of such elements may be identified by a similar or identical reference number.

Referring to FIG. 17, the channel structure 130 may include an upper portion 130a, which is formed of or includes a doped semiconductor material, and a lower portion 130b, which is formed of or includes an intrinsic semiconductor material. The doped semiconductor material may contain phosphorus (P), boron (B), etc. as impurities. The upper portion 130a of the channel structure 130 may be adjacent to or in contact with the conductive pattern 160, and the lower portion 130b of the channel structure 130 may be adjacent to or in contact with the first insulating pattern 140. This channel structure 130 as improved electrical characteristics.

The forming of the channel structure 130 may include depositing the channel layer 132, which contains an intrinsic semiconductor material, on the layered structure TS and doping an exposed portion of the channel layer 132 with impurities. Here, the depositing of the channel layer 132 may be performed using the method described with reference to FIG. 8, and the doping of the channel layer 132 may be performed after the selective etching process described with reference to FIG. 11 and before the conductive layer 162 has been formed.

Figure 18:
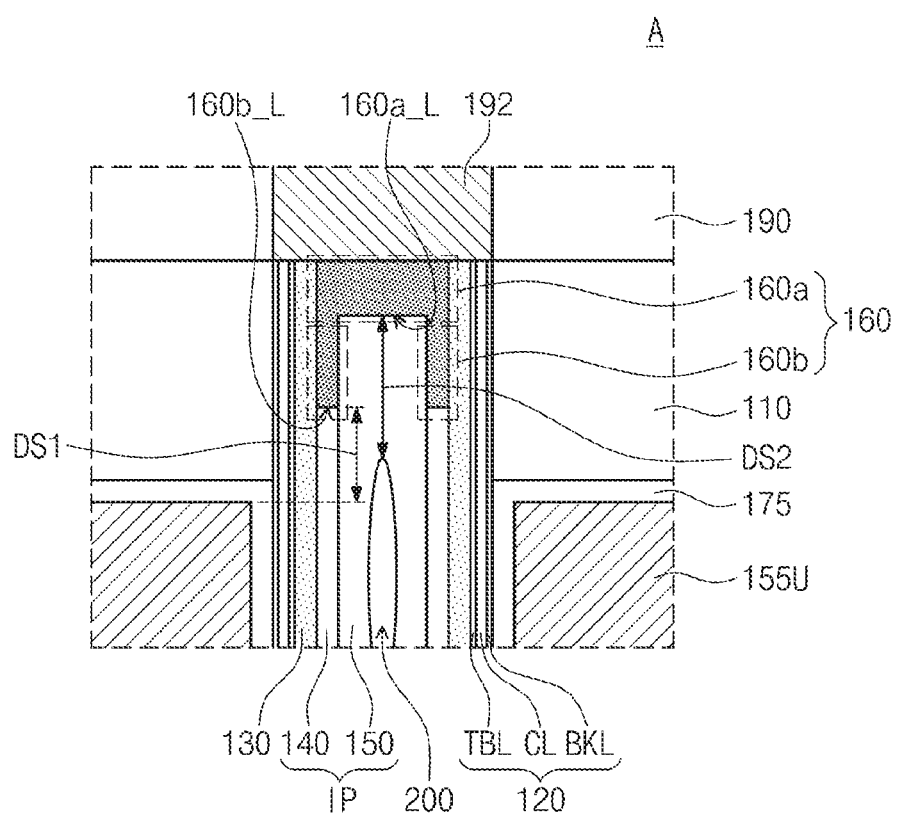
FIG. 18 is an enlarged sectional view, which is provided to correspond to the portion 'A' of FIG. 3 and to illustrate a three-dimensional semiconductor device according to some other examples of the inventive concept.

FIG. 18 is an enlarged sectional view of a portion, corresponding to the portion 'A' of FIG. 3, of still another example of three-dimensional semiconductor device according to the inventive concept. For brevity, i.e., to avoid the necessity of repeating the detailed description of elements previously described with reference to FIGS. 2 to 5, each of such elements may be identified by a similar or identical reference number.

Referring to FIG. 18, the second insulating pattern 150 may have a void (or seam) 200. The second insulating pattern 150 may be a pillar-shaped structure extending upright in the third direction D3 that is normal to the top surface of the substrate 100, and the void 200 may also extend in the longitudinal direction of the second insulating pattern 150. The void 200 may be locally provided in the second insulating pattern 150.

The extent or form of the void 200 may be dependent on process conditions in a deposition process for forming the second insulating layer 152, described with reference to FIG. 9. The greater the number of the sacrificial and insulating layers 104 and 110 stacked on the substrate 100, the greater the height of the layered structure TS, and aspect ratio of the through hole H extending through the layered structure TS. The void 200 may be formed in the second insulating layer 152 especially in the case in which the aspect ratio of the through hole H, in which the second insulating layer 152 is formed, is relatively great.

In the case in which a distance DS2 between the conductive pattern 160 and the void 200 is relatively small, conductive material of the conductive pattern 160 could be deposited into the void 200. This could degrade the electrical characteristics of the channel structure 130.

According to an aspect of the inventive concept, the bottom surface 160a_L of the first portion 160a of the conductive pattern 160 may be positioned at a level higher than that of the bottom surface 160b_L of the second portion 160b of the conductive pattern 160, relative to the substrate 100. Thus, the distance DS2 between the void 200 and the conductive pattern 160 may be maximized. This may make it possible to increase a process margin between the conductive pattern 160 and the void 200 to obviate the potential problem of degradation electrical characteristics of the channel structure 130 by the conductive pattern 160. In addition, since, relative to the substrate 100, the bottom surface 160b_L of the second portion 160b of the conductive pattern 160 is positioned at a level lower than the bottom surface 160a_L of the first portion 160a of the conductive pattern 160, the distance DS1 between the upper gate electrode 155U and the conductive pattern 160 may be minimized Thus, the electric resistance of the channel structure 130 may be suppressed.

Figure 19:
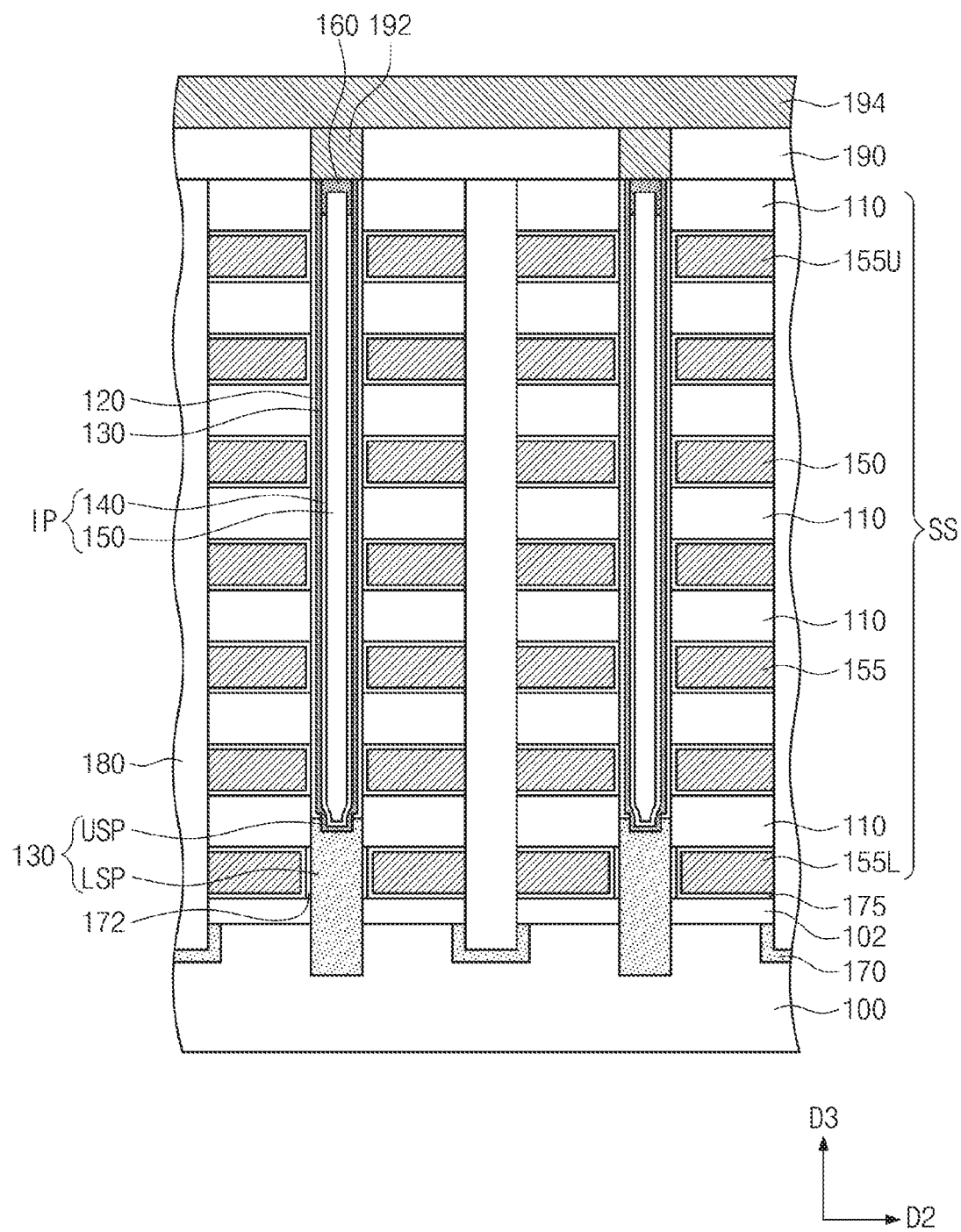
FIG. 19 is a sectional view which is taken along line I-I' of FIG. 2 to illustrate a three-dimensional semiconductor memory device according to some examples of the inventive concept.

FIG. 19 is a sectional view of another example of a three-dimensional semiconductor memory device according to the inventive concept which is taken in a direction corresponding to that of line I-I' of FIG. 2. For brevity, i.e., to avoid the necessity of repeating the detailed description of elements previously described with reference to FIGS. 2 to 5, each of such elements may be identified by a similar or identical reference number.

Referring to FIG. 19, the channel structure 130 may include a lower semiconductor pattern LSP, which extends through a lower portion of the stack SS and at least a portion of the substrate 100 and is connected to the substrate 100, and an upper semiconductor pattern USP, which extends through an upper portion of the stack SS and is connected to the lower semiconductor pattern LSP.

The upper semiconductor pattern USP may be a pipe-shaped or tubular structure. A bottom portion of the upper semiconductor pattern USP may be closed. A bottom surface of the upper semiconductor pattern USP may be located at a level lower than the top surface of the lower semiconductor pattern LSP, relative to the substrate 100. In other words, part of the upper semiconductor pattern USP may be received in the lower semiconductor pattern LSP. The upper semiconductor pattern USP may be a pattern of doped material or intrinsic semiconductor material. The lower semiconductor pattern LSP may be formed of a semiconductor material having the same conductivity type as that of the substrate 100. The lower semiconductor pattern LSP may be an epitaxial pattern that is grown using the substrate 100 as a seed layer. The lower semiconductor pattern LSP may be formed of or include a semiconductor material having a single- or poly-crystalline structure. The lower semiconductor pattern LSP may be in contact with an inner surface of the substrate 100. The lower semiconductor pattern LSP may have the form of a pillar penetrating at least a portion of the substrate 100.

The insulating gap-fill pattern IP may be provided to fill an inner space of the upper semiconductor pattern USP. The insulating gap-fill pattern IP may be provided in the upper semiconductor pattern USP and may be surrounded by the upper semiconductor pattern USP, when viewed in a plan view. The insulating gap-fill pattern IP may be substantially the same as the insulating gap-fill pattern IP described with reference to FIGS. 2 to 5, except that it is provided in the upper semiconductor pattern USP.

The conductive pattern 160 may be provided on the insulating gap-fill pattern IP. At least a portion of the insulating gap-fill pattern IP may extend into the conductive pattern 160. At least a portion of the conductive pattern 160 may be provided in the upper semiconductor pattern USP and may be surrounded by the upper semiconductor pattern USP, when viewed in a plan view. The conductive pattern 160 may be substantially the same as the conductive pattern 160 described with reference to FIGS. 2 to 5, except that it is provided in the upper semiconductor pattern USP.

The lower gate electrode 155L may be provided adjacent to the lower semiconductor pattern LSP. The upper gate electrode 155U and the cell gate electrodes 155 may be provided adjacent to the upper semiconductor pattern USP. The vertical insulator 120 may be interposed between the stack SS and the upper semiconductor pattern USP. The vertical insulator 120 may be interposed between each of the upper and cell gate electrodes 155L and 155 and the upper semiconductor pattern USP. A bottom surface of the vertical insulator 120 may be in contact with at least a portion of the top surface of the lower semiconductor pattern LSP.

A gate dielectric pattern 172 may be provided between the lower semiconductor pattern LSP and the lower gate electrode 155L. The gate dielectric pattern 172 may be formed of or include a silicon oxide layer, for example.

Figure 20:
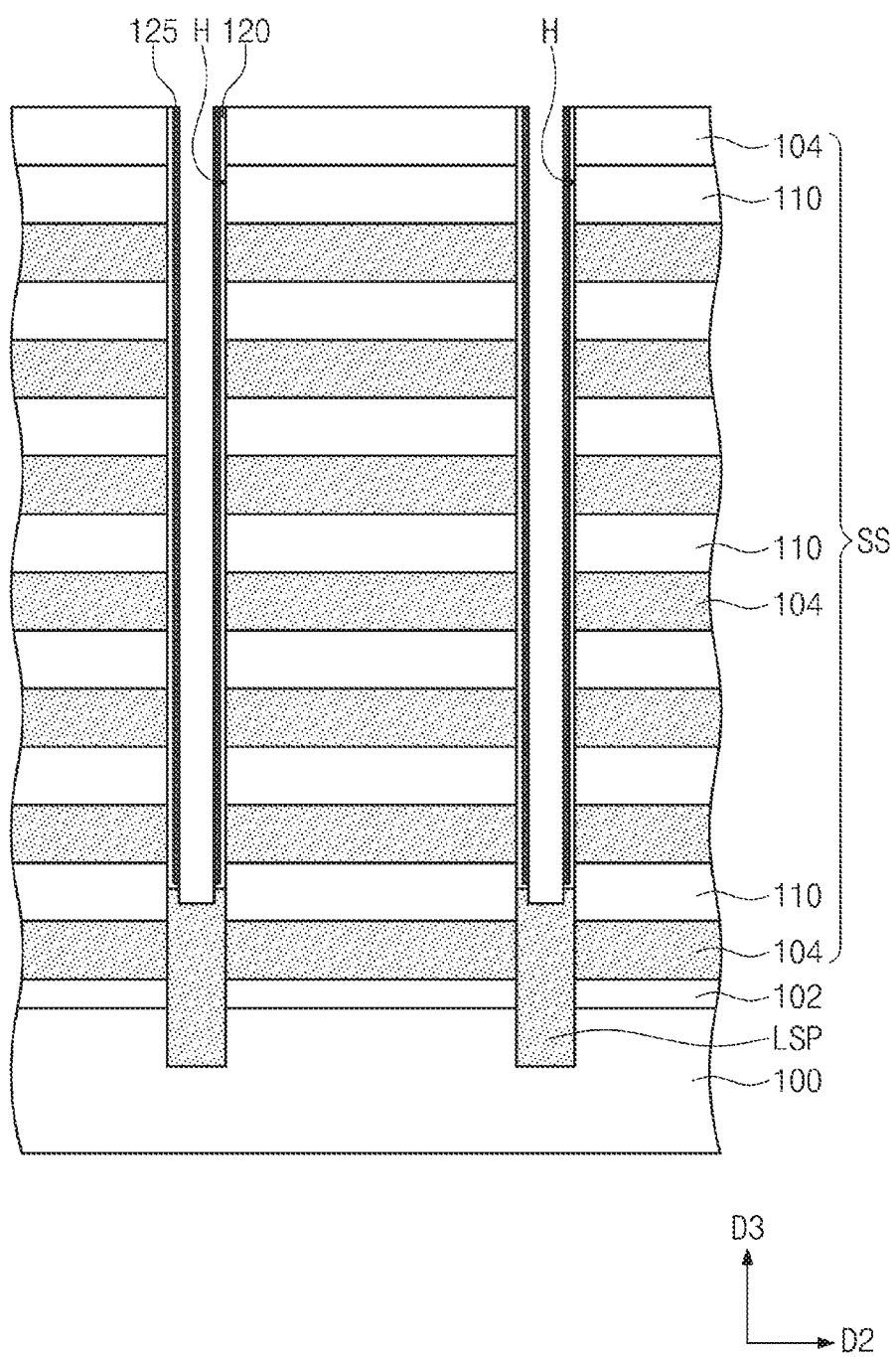
FIG. 20 is a sectional view of a three-dimensional semiconductor memory device during the course of its manufacture, which is taken in a direction corresponding to that of line I-I' of FIG. 2 to illustrate some examples of a method of fabricating a three-dimensional semiconductor memory device according to the inventive concept.

FIG. 20 is a sectional view, taken in a direction corresponding to that of line I-I' of FIG. 2 of a three-dimensional semiconductor memory device during the course of its manufacture so as to illustrate another example of a method of manufacturing a three-dimensional semiconductor memory device according to the inventive concept. For brevity, detailed descriptions of element and steps the same as those previously described with reference to FIGS. 6 to 15 may be omitted.

As described with reference to FIGS. 6 and 7, the lower insulating layer 102 may be formed on the substrate 100. The layered structure TS may be formed on the lower insulating layer 102, and the through hole H may be formed through the layered structure TS and to expose the substrate 100. In some examples, the layered structure TS may include the sacrificial layers 104 and the insulating layers 110, which are alternately and repeatedly deposited on the lower insulating layer 102.

Referring to FIG. 20, a lower semiconductor pattern LSP may be formed to fill a lower region of the through hole H. The lower semiconductor pattern LSP may be formed by a selective epitaxial growth process, in which the substrate 100 exposed by the through hole H is used as a seed layer. The lower semiconductor pattern LSP may be formed to penetrate at least a portion of the substrate 100 and to have the form of a pillar. In some examples, the lower semiconductor pattern LSP may be formed to cover at least part of a side surface (inner) of the lowermost one of the insulating layers 110. A top surface of the lower semiconductor pattern LSP may be positioned between two adjacent ones of the sacrificial layers 104, between which the lowermost one of the insulating layers 110 is interposed. The lower semiconductor pattern LSP may include a portion having a single- or poly-crystalline structure. The lower semiconductor pattern LSP may be formed of or include, for example, silicon, but the inventive concept is not limited thereto. In some examples, carbon nano structures, organic semiconductor materials, and compound semiconductors may be used for the lower semiconductor pattern LSP. The lower semiconductor pattern LSP may have the same conductivity type as the substrate 100. In certain examples, the lower semiconductor pattern LSP may be doped in an in-situ manner during the SEG process. In certain examples, after the bulk of the lower semiconductor pattern LSP has been formed, impurities may be injected into the bulk material to complete the semiconductor pattern LSP.

A vertical insulator 120 may be formed to cover an inner surface defining the through hole H provided with the lower semiconductor pattern LSP and in such a way that part of the lower semiconductor pattern LSP remains exposed. The forming of the vertical insulator 120 may include sequentially forming a vertical insulating layer and a spacer layer on the layered structure TS over the inner surface defining the through hole H, anisotropically etching the spacer layer to form a spacer pattern 125 on the inner surface defining the through hole H, and anisotropically etching the vertical insulating layer using the spacer pattern 125 as an etch mask. The anisotropic etching of the vertical insulating layer may be performed in an over-etch manner, and thus, the top of the lower semiconductor pattern LSP exposed by the spacer pattern 125 and the vertical insulator 120 may be recessed. As a result of the anisotropic etching process, a portion of the vertical insulating layer may remain under the spacer pattern 125. In this case, the vertical insulator 120 may include a bottom portion interposed between a bottom surface of the spacer pattern 125 and the top surface of the lower semiconductor pattern LSP. Thus, a bottom surface of the vertical insulator 120 may be in contact with a portion of the top surface of the lower semiconductor pattern LSP. After the forming of the vertical insulator 120, the spacer pattern 125 may be removed.

The subsequent processes may be substantially the same as those of the method shown in and described with reference to FIGS. 8 to 15.

In the present example, the lowermost one of the second recess regions R2 described with reference to FIG. 13 may be located between the lowermost one of the insulating layers 110 and the lower insulating layer 102 to partially expose the side surface of the lower semiconductor pattern LSP and may be contiguous with, i.e., may be open to, the trench T in a horizontal direction. The others of the second recess regions R2 may also be contiguous with the trench T and may be located between the insulating layers 110 to expose other portions of the side surface of the vertical insulator 120.

A gate dielectric pattern 172 may be formed in the lowermost one of the second recess regions R2. For example, the forming of the gate dielectric pattern 172 may include a thermal oxidation process of oxidizing a portion of a side surface of the lower semiconductor pattern LSP exposed by the lowermost one of the second recess regions R2. The gate dielectric pattern 172 may be formed of or include, for example, silicon oxide.

The subsequent process may be substantially the same as that in the method shown in and described with reference to FIG. 3.

Figure 21:
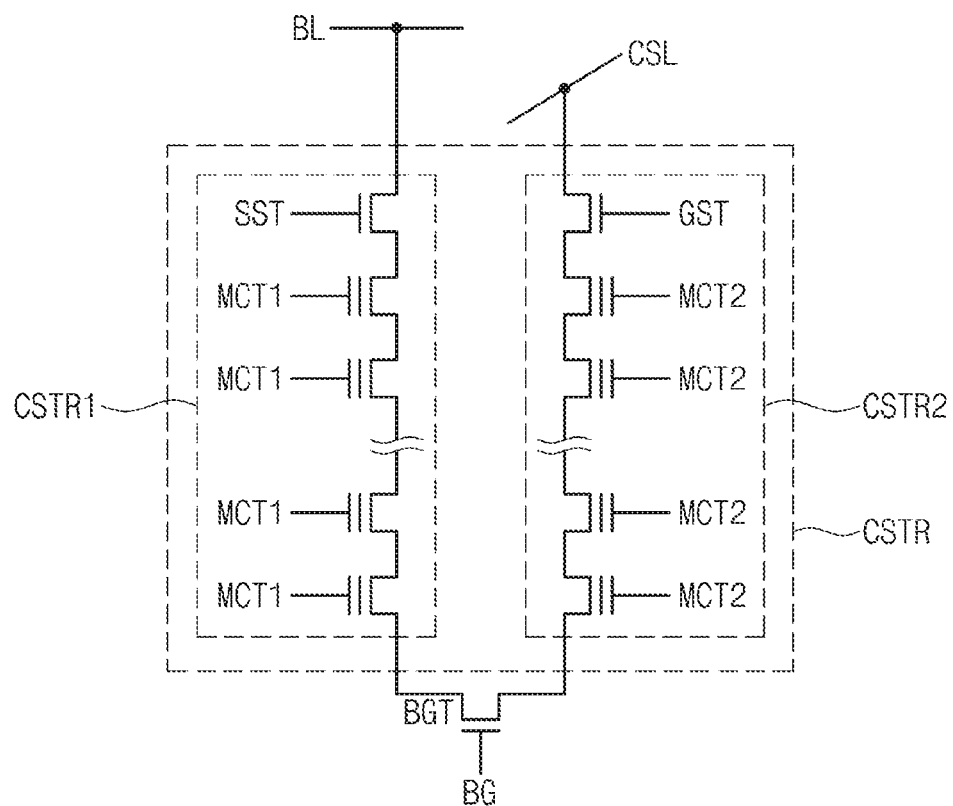
FIG. 21 is a circuit diagram schematically illustrating a cell region of a three-dimensional semiconductor memory device according to some examples of the inventive concept.

FIG. 21 is a circuit diagram schematically illustrating a cell region of some examples of a three-dimensional semiconductor memory device according to the inventive concept.

Referring to FIG. 21, a cell array of a three-dimensional semiconductor device may include a common source line CSL, a bit line BL, and a cell string CSTR between the common source line CSL and the bit line BL. The common source line CSL may be a conductive layer or pattern provided over a substrate, and the bit line BL may be conductive patterns (e.g., metal lines) provided over the substrate.

The cell string CSTR may include an upper string CSTR1 connected to the bit line BL and a lower string CSTR2 connected to the common source line CSL. The upper string CSTR1 may be connected to the lower string CSTR2 through a switching device BGT. The switching device BGT may be provided in the substrate and be connected to a back-gate BG in the substrate. The upper string CSTR1 may include a string selection transistor SST, which is coupled to the bit line BL, and a plurality of upper memory cell transistors MCT1 provided between the string selection transistor SST and the switching device BGT. The string selection transistor SST and the upper memory cell transistors MCT1 may be connected in series. The lower string CSTR2 may include a ground selection transistor GST, which is coupled to the common source line CSL, and a plurality of lower memory cell transistors MCT2 provided between the ground selection transistor GST and the switching device BGT. The ground selection transistor GST and the lower memory cell transistors MCT2 may be connected in series. Each of the upper and lower memory cell transistors MCT1 and MCT2 may include a data storage element.

Figure 22:
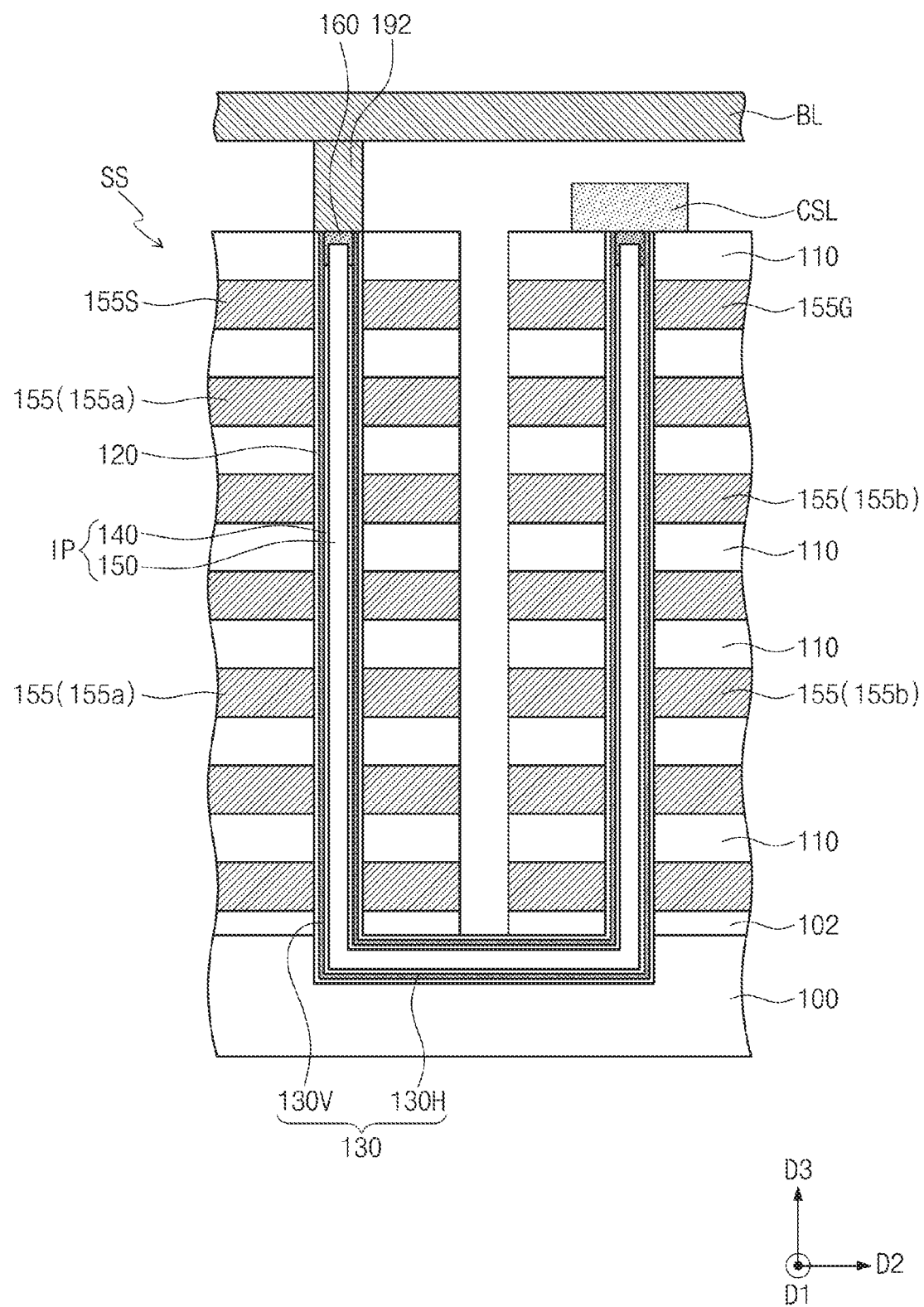
FIG. 22 is a sectional view illustrating a three-dimensional semiconductor device according to some examples of the inventive concept.

FIG. 22 is a sectional view of a three-dimensional semiconductor device according to the inventive concept.

Referring to FIG. 22, a three-dimensional semiconductor device may include a substrate 100, a bit line BL on the substrate 100, a stack SS between the substrate 100 and the bit line BL, a common source line CSL between the stack SS and the bit line BL, and a channel structure 130 penetrating the stack SS. The channel structure 130 may be provided to electrically connect the bit line BL to the common source line CSL. The channel structure 130 may be connected to the bit line BL through a contact plug 192, which is provided between the stack SS and the bit line BL.

The stack SS may include a plurality of cell gate electrodes 155, which are sequentially stacked on the substrate 100, and selection gate electrodes, which are provided on the cell gate electrodes 155. The selection gate electrodes may include a string selection gate electrode 155S, which is provided between the cell gate electrodes 155 and the bit line BL, and a ground selection gate electrode 155G, which is provided between the cell gate electrodes 155 and the common source line CSL. In some examples, the cell gate electrodes 155, the string selection gate electrode 155S, and the ground selection gate electrode 155G may extend in a first direction D1. The string selection gate electrode 155S and the ground selection gate electrode 155G may be spaced apart from each other in a second direction D2 that is not parallel to the first direction D1. The cell gate electrodes 155 may include upper gate electrodes 155a, which are provided between the substrate 100 and the string selection gate electrode 155S, and lower gate electrodes 155b, which are provided between the substrate 100 and the ground selection gate electrode 155G. The upper gate electrodes 155a and the lower gate electrodes 155b may be spaced apart from each other in the second direction D2.

The channel structure 130 may include a pair of vertical portions 130V, which extend through the stack SS, and a horizontal portion 130H, which are provided below the stack SS to connect the pair of vertical portions 130V to each other. One of the pair of vertical portions 130V may be connected to the common source line CSL, and the other of the pair of vertical portions 130V may be connected to the bit line BL. The horizontal portion 130H may be provided between the substrate 100 and the stack SS to connect the pair of vertical portions 130V to each other. One of the pair of vertical portions 130V may penetrate the lower gate electrodes 155b and the ground selection gate electrode 155G and may be connected to the common source line CSL, and the other may penetrate the upper gate electrodes 155a and the string selection gate electrode 155S and may be connected to the bit line BL through the contact plug 192. To connect the pair of vertical portions 130V to each other, the horizontal portion 130H may include portions that are provided below the upper and lower gate electrodes 155a and 155b, respectively, and are connected to each other.

The channel structure 130 may be a pipe-shaped or tubular structure. The channel structure 130 may have open ends. For example, each of the vertical portions 130V may be a pipe-shaped or tubular structure with an open top and open bottom, and the horizontal portion 130H may be a pipe-shaped or tubular structure with open ends. An inner space of each of the vertical portions 130V may be contiguous with an inner space of the horizontal portion 130H. The channel structure 130 may be pattern of material doped so as to be a semiconductor or a pattern intrinsic semiconductor material. At least a portion of the channel structure 130 may have one of a single crystalline, polycrystalline, and amorphous structure. In the present example, the channel structures 130 are substantially the same as the channel structures 130 described with reference to FIGS. 2 to 5, except that they include the horizontal portion 130H.

An insulating gap-fill pattern IP may be provided to fill an inner space of the channel structure 130. The insulating gap-fill pattern IP may be provided in an inner space of each of the vertical portions 130V of the channel structure 130 and may be surrounded by each of the vertical portions 130V, when viewed in a plan view. In addition, the insulating gap-fill pattern IP may be provided to fill an inner space of the horizontal portion 130H of the channel structure 130.

The insulating gap-fill pattern IP may include a first insulating pattern 140 and a second insulating pattern 150. The first insulating pattern 140 may be provided to cover an inner surface of the channel structure 130. The first insulating pattern 140 may be a pipe-shaped or tubular structure with open ends. The second insulating pattern 150 may be provided to fill an inner space of the first insulating pattern 140. For example, the second insulating pattern 150 may be provided in the inner space of the first insulating pattern 140, and in this case, it may be surrounded by the first insulating pattern 140, when viewed in a plan view. The second insulating pattern 150 may have the shape of a pillar. The first insulating pattern 140 may be provided to at least partially expose a side surface of the second insulating pattern 150. For example, the first insulating pattern 140 may be provided to expose a side surface of an upper portion of the second insulating pattern 150. In the present example, the insulating gap-fill pattern IP is substantially the same as the insulating gap-fill pattern IP shown in and described with reference to FIGS. 2 to 5, except that it also fills the inner space of the horizontal portion 130H of the channel structure 130.

A conductive pattern 160 may be provided on the insulating gap-fill pattern IP. At least a portion of the insulating gap-fill pattern IP may extend into the conductive pattern 160. For example, the first insulating pattern 140 may be provided to expose the side surface of the upper portion of the second insulating pattern 150, and the upper portion of the second insulating pattern 150 may extend into the conductive pattern 160. The exposed side surface of the upper portion of the second insulating pattern 150 may be covered with the conductive pattern 160. The conductive pattern 160 may cover the top surface of the second insulating pattern 150 and may be extended along the exposed side surface of the second insulating pattern 150, thereby being in contact with the topmost surface of the first insulating pattern 140. At least a portion of the conductive pattern 160 may be provided in the channel structure 130 and may be surrounded by the channel structure 130, when viewed in a plan view. The portion of the conductive pattern 160 provided in the channel structure 130 may be interposed between the channel structure 130 and the second insulating pattern 150. At least a portion of the second insulating pattern 150 may be spaced apart from the channel structure 130 with the above-mentioned portion of the conductive pattern 160 interposed therebetween. In the present examples, the conductive pattern 160 may be substantially the same as the conductive pattern 160 shown in and described with reference to FIGS. 2 to 5.

A vertical insulator 120 may be interposed between the stack SS and the channel structure 130. The vertical insulator 120 may extend into a region between the channel structure 130 and the substrate 100. The vertical insulator 120 may include a tunnel insulating layer, a charge storing layer, and a blocking insulating layer, which are provided to sequentially cover an outer surface of the channel structure 130. In the present example, the vertical insulator 120 is substantially the same as the vertical insulator 120 shown in and described with reference to FIGS. 2 to 5, except that it also extends between the channel structure 130 and the substrate 100.

Although not shown, a switching device may be provided in the substrate 100 and may be used to control a flow of current passing through the horizontal portion 130H of the channel structure 130.

In some examples, the bottom surface 160a_L of the first portion 160a of the conductive pattern 160 may be positioned at a level higher than the bottom surface 160b_L of the second portion 160b of the conductive pattern 160, relative to the substrate 100. More particularly, according to some examples of the inventive concept as described above, the conductive pattern 160 has a first portion 160a having bottom surface 160a_L facing towards the substrate 100, and a second portion 160b disposed radially outwardly of the first portion 160a and having a bottom surface 160b_L facing towards the substrate 100. The bottom surface 160a_L of the first portion 160a of the conductive pattern 160a is situated at a level higher than that of the bottom surface 160b_L of the second portion 160b of the conductive pattern 160, relative to the upper surface of the substrate 100. The bottom surface 160b_L of the second portion 160b of the conductive pattern 160 is situated at a level closer to that of an uppermost one of the gate electrodes 155, i.e., the upper gate electrode 155U, than a level at which the bottom surface 160a_L of the first portion 160 of the conductive pattern 160 is situated.

Accordingly, it may be possible to reduce the distance DS1 between the upper gate electrode 155U and the conductive pattern 160 and thus to suppress electric resistance of the channel structure 130. Furthermore, it may be possible to maximize the distance DS2 between a void 200 formed in the second insulating pattern 150 and the conductive pattern 160. This may make it possible to prevent electrical characteristics of the channel structure 130 from being degraded.

Accordingly, it may be possible to realize a three-dimensional semiconductor device with improved electrical characteristics and high reliability.

Although examples of the inventive concept have been particularly shown and described, it will be understood by one of ordinary skill in the art that variations in form and detail may be made therein without departing from the spirit and scope of the inventive concept as defined by the attached claims.

What is claimed is:

1. A three-dimensional semiconductor device comprising:
a stack of layers comprising gate electrodes disposed one over another on a substrate;
a channel structure extending through the gate electrodes and connected to the substrate;
an insulating gap-fill pattern disposed within the channel structure and surrounded by the channel structure as viewed in a plan view; and
a conductive pattern on the insulating gap-fill pattern, wherein:
a portion of the insulating gap-fill pattern extends into the conductive pattern,
at least a portion of the conductive pattern is interposed between the portion of the insulating gap-fill pattern and the channel structure, and
the portion of the insulating gap-fill pattern is spaced apart from the channel structure by the at least a portion of the conductive pattern.

2. A three-dimensional semiconductor device comprising:
a stack of layers comprising gate electrodes disposed one over another on a substrate;
a channel structure extending through the gate electrodes to the substrate;
an insulating gap-fill pattern disposed within the channel structure and surrounded by the channel structure as viewed in a plan view; and
a conductive pattern on the insulating gap-fill pattern, wherein:
the insulating gap-fill pattern comprises a first insulating pattern covering an inner surface of the channel structure and a second insulating pattern disposed within the first insulating pattern,
the second insulating pattern comprises a material having an etch selectivity with respect to the first insulating pattern,
a portion of the second insulating pattern extends into the conductive pattern,
the channel structure extends along a side surface of the first insulating pattern and a side surface of the conductive pattern, and
at least a portion of the second insulating pattern is spaced apart from the channel structure, and the first insulating pattern and the conductive pattern are interposed between the second insulating pattern and the channel structure.

3. A three-dimensional semiconductor device comprising:
a stack of layers comprising gate electrodes disposed one over another on a substrate;
a channel structure extending through the gate electrodes to the substrate;
an insulating gap-fill pattern disposed within the channel structure and surrounded by the channel structure as viewed in a plan view; and
a conductive pattern on the insulating gap-fill pattern, wherein:
the insulating gap-fill pattern comprises a first insulating pattern covering an inner surface of the channel structure; and a second insulating pattern disposed within the first insulating pattern,
the second insulating pattern comprises a material having an etch selectivity with respect to the first insulating pattern, a portion of the second insulating pattern extends into the conductive pattern, the channel structure extends along a side surface of the first insulating pattern and a side surface of the conductive pattern, a topmost surface of the first insulating pattern is situated at a level lower than that of a topmost surface of the channel structure, relative to the substrate, at least a portion of the conductive pattern is in contact with the topmost surface of the first insulating pattern, and the topmost surface of the first insulating pattern is situated at a level lower than that of a top surface of the second insulating pattern, relative to the substrate.

4. The three-dimensional semiconductor device of claim 3, wherein the at least a portion of the conductive pattern is interposed between the second insulating pattern and the channel structure.

5. The three-dimensional semiconductor device of claim 4, wherein the topmost surface of the channel structure is positioned at a level higher than that of the top surface of the second insulating pattern, relative to the substrate.

6. The three-dimensional semiconductor device of claim 3, wherein the topmost surface of the first insulating pattern is positioned at a level higher than that of a top surface of an uppermost one of the gate electrodes, relative to the substrate.

* * * * *